(12) United States Patent
Taniguchi et al.

(10) Patent No.: US 7,455,948 B2
(45) Date of Patent: Nov. 25, 2008

(54) PHOTOSENSITIVE RESIN COMPOSITION

(75) Inventors: Ryuichiro Taniguchi, Kyoto (JP); Tomoyuki Yuba, Kyoto (JP); Masao Tomikawa, Shiga (JP)

(73) Assignee: Toray Industries, Inc., Tokyo (JP)

( * ) Notice: Subject to any disclaimer, the term of this patent is extended or adjusted under 35 U.S.C. 154(b) by 299 days.

(21) Appl. No.: 11/274,222

(22) Filed: Nov. 16, 2005

(65) Prior Publication Data

US 2006/0110680 A1 May 25, 2006

(30) Foreign Application Priority Data

Nov. 24, 2004 (JP) .............................. 2004-338702

(51) Int. Cl.
*G03F 7/021* (2006.01)
*G03F 7/023* (2006.01)

(52) U.S. Cl. ...................... 430/176; 430/191; 430/192; 430/193; 430/270.1

(58) Field of Classification Search ................. 430/191, 430/192, 193, 176, 270.1
See application file for complete search history.

(56) References Cited

U.S. PATENT DOCUMENTS

| 5,550,004 | A | 8/1996 | Honda |
| 6,190,833 | B1 * | 2/2001 | Shiota et al. ............. 430/280.1 |
| 6,329,110 | B1 | 12/2001 | Nunomura et al. |
| 6,600,006 | B2 | 7/2003 | Jung et al. |
| 6,929,891 | B2 * | 8/2005 | Rushkin et al. ............... 430/18 |
| 7,132,205 | B2 * | 11/2006 | Rushkin et al. ............... 430/18 |
| 2003/0194631 | A1 | 10/2003 | Suwa et al. |

FOREIGN PATENT DOCUMENTS

| EP | 0 477 691 | 4/1992 |
| JP | 2001-42527 | 2/2001 |
| JP | 2001-312051 | 11/2001 |
| JP | 2002-122993 | 4/2002 |
| JP | 2002-169283 | 6/2002 |
| JP | 2003-121998 | 4/2003 |
| JP | 2004/239947 | 8/2004 |

* cited by examiner

*Primary Examiner*—John S Chu
(74) *Attorney, Agent, or Firm*—Morrison & Foerster LLP

(57) ABSTRACT

This invention relates to a positive photosensitive resin composition allowing development with an alkaline aqueous solution and excellent in resolution, photosensitivity and pattern form even if the film formed from the resin is thick.

Furthermore, this invention relates to a photosensitive resin composition comprising (a) a polymer having one or more phenolic hydroxyl groups, (b) a compound having a phenolic hydroxyl group and containing only one group selected from a methylol group and alkoxymethyl group, and (c) a photo acid generator.

9 Claims, No Drawings

PHOTOSENSITIVE RESIN COMPOSITION

TECHNICAL AREA

The present invention relates to a photosensitive resin composition. In more detail, it relates to a positive photosensitive resin composition, the portion of which exposed to ultraviolet light can be dissolved in an alkaline developer, suitable as a surface protective coat of a semiconductor device, interlayer dielectric film, dielectric film of an organic electro-luminescent element, etc.

BACKGROUND ART

Known positive heat-resistant resin precursor compositions, the exposed portions of which can be dissolved by development, include compositions obtained by adding a quinone diazide to any of polyamic acids, compositions obtained by adding a quinone diazide to any of soluble polyimides having hydroxyl groups, compositions obtained by adding a quinone diazide to any of polyamides having hydroxyl groups, etc.

However, the compositions obtained by adding a quinone diazide to any of conventional polyamic acids have a problem that since the solubility of carboxyl groups of the polyamic acid is higher than the effect of the quinone diazide to inhibit the dissolution into an alkali no desired pattern can be obtained in most cases. Furthermore, the compositions obtained by adding a quinone diazide to any of soluble polyimide or polyamide resins having hydroxyl groups in its main chain little cause the above-mentioned problem but have such problems that the structure is limited for making soluble and that the resistance of the resin obtained after heat treatment to organic solvents is low.

So, in order to control the alkali solubility of a polyamic acid, polyamic acid derivatives, in which the carboxyl groups of the polyamic acid were protected by ester groups, were developed. However, the compositions obtained by adding a naphthoquinone diazide to any of the polyamic acid derivatives have a problem that the photosensitivity is very considerably lowered, though a desired pattern can be obtained in most cases, since the effect of the naphthoquinone diazide to inhibit the dissolution in an alkali is very large.

Recently developed methods for enhancing the photosensitivity include the compositions obtained by adding any of phenolic hydroxyl group-containing thermally crosslinkable compounds to any of polyamic esters and/or polyamic acid polymers (see patent document 1), the compositions obtained by adding any of compounds having two or more alkoxymethyl groups and phenolic hydroxyl groups in the molecule to any of polyimide precursors or polyimides soluble in alkaline aqueous solutions (see patent documents 2 and 3), the compositions obtained by adding any of compounds having plural methylol groups and phenolic hydroxyl groups (see patent document 4), the compositions obtained by any of iodonium salts as a dissolution inhibitor to any of polyamide precursors or polyimides (see patent document 5), the compositions obtained by adding any of iodonium salts as a dissolution inhibitor to any of polyamides (see patent document 6), the compositions obtained by adding any of photo acid generators and any of vinyloxy group-containing compounds to any of polyamic esters (see patent document 7), and the compositions obtained by adding any of photo acid generators to any of polyamic esters having acid degradable groups (see patent document 8). These compositions have such problems that sufficient photosensitivity cannot be obtained in the case where the cured film formed of any of the compositions has a thickness of more than 10 µm and that even if sufficient photosensitivity is obtained, the pattern is strained or deformed, not allowing both a good pattern and sufficient photosensitivity to be obtained.

[Patent document 1] U.S. Patent Publication 2003/194631 (claim 1)

[Patent document 2] JP2003-121998A (claims 1 and 5)

[Patent document 3] JP2001-312051A (claim 3)

[Patent document 4] U.S. Pat. No. 6,329,110 (claims 9 and 10)

[Patent document 5] JP2001-42527A (clams 10 through 12)

[Patent document 6] JP2002-169283A (claims 6 and 7)

[Patent document 7] JP2002-122993A (claim 1)

[Patent document 8] U.S. Pat. No. 6,600,006 (claims 15 and 19)

OBJECT OF THE INVENTION

The prior art for enhancing the photosensitivity have a problem that in the case where the cured film has a thickness of more than 10 µm, both sufficient photosensitivity and a well formed pattern cannot be obtained. The object of this invention is to provide a photosensitive resin composition capable of sustaining both high photosensitivity and a well formed pattern even if the film has such a large thickness.

DISCLOSURE OF THE INVENTION

The present invention is a photosensitive resin composition comprising (a) a polymer having one or more phenolic hydroxyl groups, (b) a compound having a phenolic hydroxyl group and containing only one group selected from a methylol group and alkoxymethyl group, and (c) a photo acid generator.

This invention can provide a positive photosensitive-resin composition that allows development using an alkaline aqueous solution and is excellent in resolution, photosensitivity and pattern form even if the cured film formed of the composition has a thickness of more than 10 µm.

THE BEST MODES FOR CARRYING OUT THE INVENTION

The polymer having one or more phenolic hydroxyl groups (a) refers to a polymer having at least one phenolic hydroxyl group at the main chain or side chains of the polymer. It is preferred to have one or more phenolic hydroxyl groups in each structural unit. Particular examples of the polymer include polyhydroxystyrene, novolac resins, resol resins and polyphenol resins, though not limited to them.

More preferred is a polymer having the structural units represented by the following general formula (1) as a main component. The polymer can be converted into a polymer having imide rings, oxazole rings or other cyclic structure by means of heating or any adequate catalyst. Preferred is a polyamic acid or polyamic ester as a polyimide precursor, or polyhydroxyamide as a polybenzoxazole precursor. A polymer having a cyclic structure is remarkably improved in heat resistance and resistance to organic solvents.

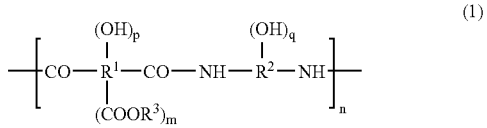
(1)

In the above general formula (1), $R^1$ denotes a divalent to octavalent organic group with 2 or more carbon atoms and expresses a structural component of an acid. The divalent group can be, for example, the residue obtained by removing two carboxyl groups from a aromatic dicarboxylic acid such as terephthalic acid, isophthalic acid, diphenyl ether dicarboxylic acid, naphthalenedicarboxylic acid, or bis(carboxyphenyl)propane or from an aliphatic dicarboxylic acid such as cyclohexanedicarboxylic acid and adipic acid. The trivalent group can be, for example, the residue obtained by removing three carboxyl groups from a tricarboxylic acid such as trimellitic acid, or trimesic acid. The tetravalent group can be, for example, the residue obtained by removing four carboxyl groups from a tetracarboxylic acid such as pyromellitic acid, benzophenonetetracarboxylic acid, biphenyltetracarboxylic acid, or diphenyl ether tetracarboxylic acid. Furthermore, any one of these acid components can be used or two or more of them can also be used as a mixture. However, it is preferred that the residue obtained by removing four carboxyl groups from a tetracarboxylic acid accounts for 1 to 40 mol % of all $R^1$s.

It is preferred that the acid components constituting the structural unit represented by the general formula (1) contain a trivalent to octavalent organic group with 2 or more carbon atoms and 1 to 4 hydroxyl groups. It is more preferred that a trivalent or tetravalent organic group with 6 to 30 carbon atoms is contained. Particularly a structure in which the $R_1(COOR^3)_m(OH)_p$ of the general formula (1) is represented by general formula (6) is preferred.

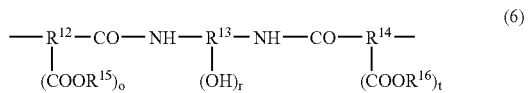
(6)

In the general formula (6), $R^{12}$ and $R^{14}$ denote, respectively independently, a divalent to tetravalent organic group with 2 to 20 carbon atoms; $R^{13}$ denotes a trivalent to hexavalent organic group with 3 to 20 carbon atoms; $R^{15}$ and $R^{16}$ denote, respectively independently, a hydrogen or organic group with 1 to 20 carbon atoms; o and t denote, respectively independently, an integer of 0 to 2; and r denotes an integer of 1 to 4.

In view of the heat resistance of the obtained polymer, it is more preferred that $R^{12}$ and $R^{14}$ respectively contain an aromatic ring. Above all, an especially preferred structure is, for example, the residue obtained by removing three carboxyl groups from trimellitic acid, trimesic acid or naphthalenetricarboxylic acid. Furthermore, $R^{13}$ denotes a trivalent to hexavalent organic group with 3 to 20 carbon atoms. Moreover, it is preferred that the r hydroxyl groups bonded to $R^{13}$ are positioned adjacently to the amide bonds. Such $R^{13}(OH)_r$ can be, for example, the residue obtained by removing two amino groups from bis(3-amino-4-hydroxyphenyl)hexafluoropropane or bis(3-hydroxy-4-aminophenyl)hexafluoropropane respectively containing fluorine atoms, or from bis(3-amino-4-hydroxyphenyl)propane, bis(3-hydroxy-4-aminophenyl)propane, 3,3'-diamino-4,4'-dihydroxybiphenyl, 3,3'-dihydroxy-4,4'-diaminobiphenyl, 2,4-diamino-phenol, 2,5-diaminophenol or 1,4-diamino-2,5-dihydroxybenzene respectively not containing any fluorine atom.

Furthermore, in the general formula (6), $R^{15}$ and $R^{16}$ denote, respectively independently, a hydrogen or organic group with 1 to 20 carbon atoms. An organic group with 20 or less carbon atoms gives advantages that good alkali developability can be obtained and that the photosensitivity also becomes high. Symbols o and t denote, respectively independently, an integer of 0 to 2, but is preferably selected from integers of 1 and 2. Furthermore, r denotes an integer of 1 to 4. Symbol r being 4 or less gives an advantage that the mechanical characteristics of the composition become good.

Preferred examples of the structure represented by the general formula (6) include the following, though not limited to them.

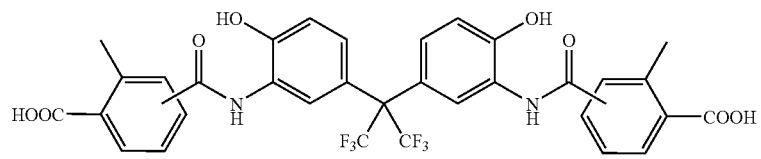

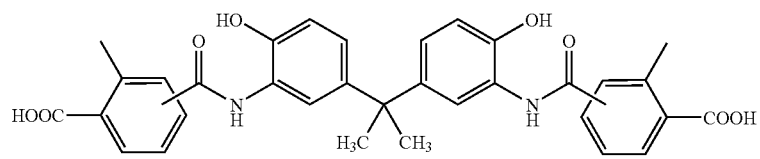

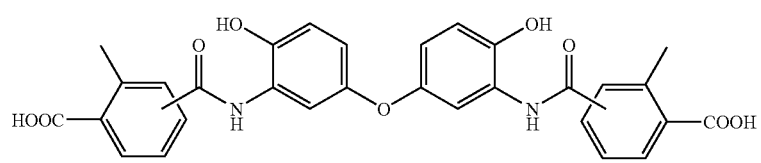

-continued

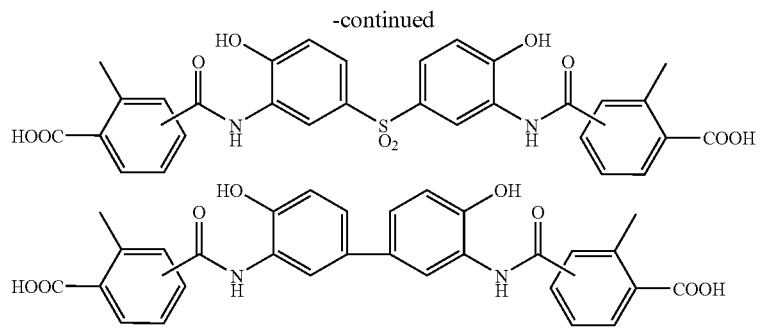

Furthermore, $R^1$ can also be copolymerized with a tetracarboxylic acid or dicarboxylic acid respectively not having any hydroxyl group to such an extent that the capability of dissolving in alkalis, photosensitive performance and heat resistance are not impaired. It can be, for example, the residue obtained by removing four carboxyl groups from an aromatic tetracarboxylic acid such as pyromellitic acid, benzophenonetetracarboxylic acid, biphenyltetracarboxylic acid, diphenylethertetracarboxylic acid, or diphenylsulfonetetracarboxylic acid, the residue obtained by removing two carboxyl groups and two alkyl ester groups from a diester compound obtained by esterifying two carboxyl groups of any of said tetracarboxylic acids using methyl groups or ethyl groups, the residue obtained by removing four carboxyl groups from an aliphatic tetracarboxylic acid such as butanetetracarboxylic acid or cyclopentanetetracarboxylic acid, the residue obtained by removing two carboxyl groups and two alkyl ester groups from a diester compound obtained by esterifying two carboxyl groups of any of the tetracarboxylic acids using methyl groups or ethyl groups, or the residue obtained by removing two carboxyl groups from an aromatic dicarboxylic acid such as terephthalic acid, isophthalic acid, diphenyletherdicarboxylic acid, or naphthalenedicarboxylic acid, or an aliphatic dicarboxylic acid such as adipic acid. It is preferred to copolymerize with 50 mol % or less of the acid component, and it is more preferred to copolymerize with 30 wt % or less. Keeping the copolymerization ratio at 50 mol % or less gives an advantage that good alkali developability can be obtained.

In the general formula (1), $R^2$ denotes a divalent to hexavalent organic group with 2 or more carbon atoms and expresses a structural component of a diamine. Of it, in view of the heat resistance of the obtained polymer, it is preferred that $R_2(OH)_q$ is, for example, a component having an aromatic ring and a hydroxyl group or carboxyl group. Particularly it can be, for example, the residue obtained by removing two amino groups from such a compound as bis(amino-hydroxyphenyl)hexafluoropropane having fluorine atoms or diaminodihydroxypyrimidine, diaminodihydroxypyridine, hydroxy-diamino-pyrimidine, diaminophenol, dihydroxybenzidine, diaminobenzoic acid, or diaminoterephthalic acid respectively not having any fluorine atom, or a structure represented by general formulae (7), (8) or (9).

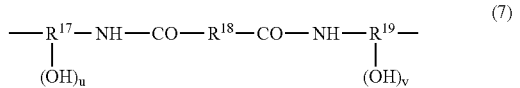

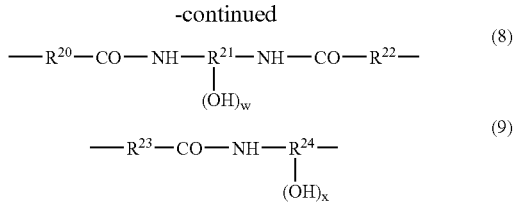

In the general formula (7), $R^{17}$ and $R^{19}$ denote, respectively independently, a trivalent or tetravalent organic group with 2 to 20 carbon atoms; and $R^{18}$ denotes a divalent organic group with 2 to 30 carbon atoms. Symbols u and v denote, respectively independently, 1 or 2. In the general formula (8), $R^{20}$ and $R^{22}$ denote, respectively independently, a divalent organic group with 2 to 20 carbon atoms, and $R^{21}$ denotes a trivalent to hexavalent organic group with 3 to 20 carbon atoms. Symbol w denotes an integer of 1 to 4. In the general formula (9), $R^{23}$ denotes a divalent organic group with 2 to 20 carbon atoms, and $R^{24}$ denotes a trivalent to hexavalent organic group with 3 to 20 carbon atoms. Symbol x denotes an integer of 1 to 4.

In the general formula (7), $R^{17}(OH)_u$ and $R^{19}(OH)_v$ respectively denote a trivalent or tetravalent organic group having a hydroxyl group with 2 to 20 carbon atoms. In view of the heat resistance of the obtained polymer, an organic group having an aromatic ring is preferred. Examples of the organic group include a hydroxyphenyl group, dihydroxyphenyl group, hydroxynaphthyl group, dihydroxynaphthyl group, hydroxybiphenyl group, dihydroxybiphenyl group, bis(hydroxyphenyl)hexafluoropropane group, bis(hydroxyphenyl)propane group, bis(hydroxyphenyl)sulfone group, hydroxydiphenyl ether group, dihydroxydiphenyl ether group, etc. Furthermore, aliphatic groups such as a hydroxycyclohexyl group and dihydroxycyclohexyl group can also be used. $R^{18}$ denotes a divalent organic group with 2 to 30 carbon atoms. In view of the heat resistance of the obtained polymer, a divalent group having an aromatic ring is desirable, and examples of the group include a phenyl group, biphenyl group, diphenyl ether group, diphenylhexafluoropropane group, diphenylpropane group, and diphenylsulfone group. In addition, an aliphatic cyclohexyl group and the like can also be used.

In the general formula (8), $R^{20}$ and $R^{22}$ denote, respectively independently, a divalent organic group with 2 to 20 carbon atoms. In view of the heat resistance of the obtained polymer, a divalent group having an aromatic ring is preferred. Examples of the group include a phenyl group, biphenyl group, diphenyl ether group, diphenylhexafluoropropane group, diphenylpropane group and diphenylsulfone group. In addition, an aliphatic cyclohexyl group and the like can also be used. $R^{21}(OH)_w$ denotes a trivalent to hexavalent organic group having a hydroxyl group with 3 to 20 carbon atoms, and in view of the heat resistance of the obtained polymer, an organic group having an aromatic ring is preferred. Examples of the organic group include a hydroxyphenyl group, dihydroxyphenyl group, hydroxynaphthyl group, dihydroxynaphthyl group, hydroxybiphenyl group, dihydroxybiphenyl group, bis(hydroxyphenyl)hexafluoropropane group, bis(hydroxyphenyl)propane group, bis(hydroxyphenyl)sulfone group, hydroxydiphenyl ether group, dihydroxydiphenyl ether group, etc. Furthermore, aliphatic groups such as a hydroxycyclohexyl group and dihydroxycyclohexyl group can also be used.

In the general formula (9), $R^{23}$ denotes a divalent organic group with 2 to 20 carbon atoms. In view of the heat resistance of the obtained polymer, a divalent group having an aromatic ring is preferred, and examples of the group include a phenyl group, biphenyl group, diphenyl ether group, diphenylhexafluoropropane group, diphenylpropane group, diphenylsulfone group, etc. In addition, an aliphatic cyclohexyl group and the like can also be used. $R^{24}(OH)_x$ denotes a trivalent to hexavalent organic group having a hydroxyl group with 3 to 20 carbon atoms, and in view of the heat resistance of the obtained polymer, an organic group having an aromatic ring is preferred. Examples of the group include a hydroxyphenyl group, dihydroxyphenyl group, hydroxynaphthyl group, dihydroxynaphthyl group, hydroxybiphenyl group, dihydroxybiphenyl group, bis(hydroxyphenyl)hexafluoropropane group, bis (hydroxyphenyl) propane group, bis (hydroxyphenyl) sulfone group, hydroxydiphenyl ether group, dihydroxydiphenyl ether group, etc. Furthermore, aliphatic groups such as a hydroxycyclohexyl group and dihydroxycyclohexyl group can also be used.

Preferred examples of the structure represented by the general formula (7) include the following, though not limited to them.

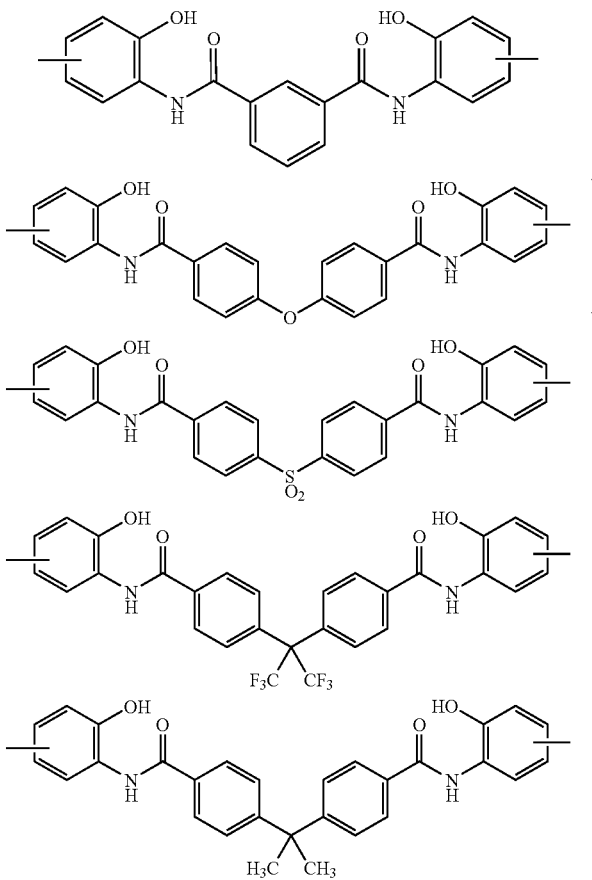

-continued

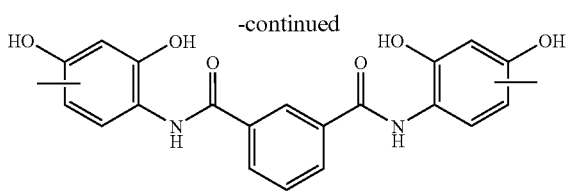

Moreover, preferred examples of the structure represented by the general formula (8) include the following, though not limited to them.

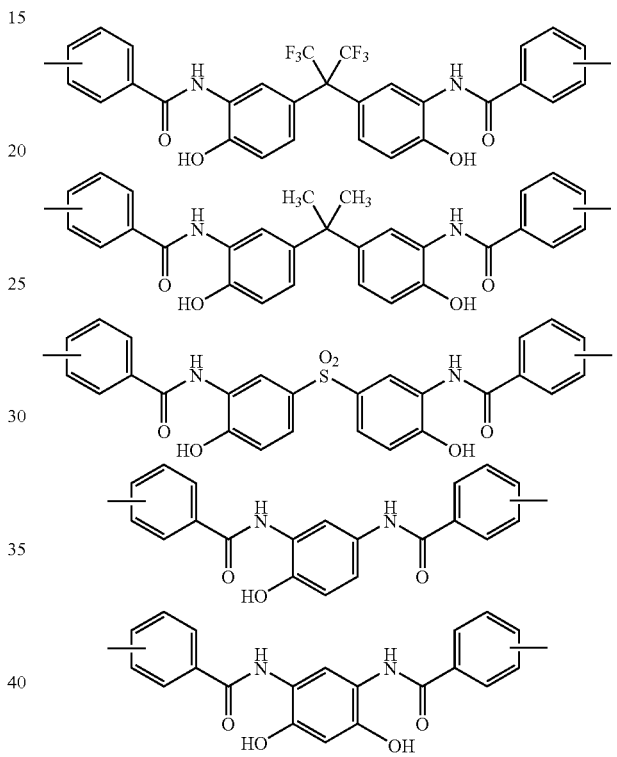

Preferred examples of the structure represented by the general formula (9) include the following, though not limited to them.

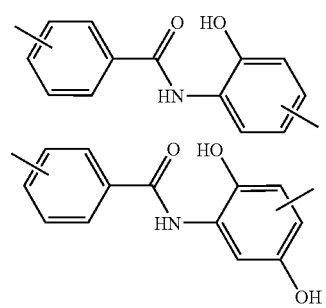

The diamine component represented by any of the general formulae (7), (8) and (9) can also be copolymerized with 1 to 40 mol % of another diamine component. The other diamine component can be, for example, the residue obtained by removing two amino groups from phenylenediamine, diaminodiphenyl ether, aminophenoxybenzene, diaminodiphenylmethane, diaminodiphenylsulfone, bis(trifluoromethyl)benzidine, bis(aminophenoxyphenyl)propane, bis(aminophenoxyphenyl)sulfone, or a compound obtained by substituting by an alkyl group or halogen atom at the aromatic ring of any of the foregoing, or the residue obtained by removing two amino groups from aliphatic cyclohexyldiamine, methylenebiscyclohexylamine or hexamethylenediamine.

Furthermore, to enhance the adhesiveness to the substrate, the $R^1$ or $R^2$ of the general formula (1) can also be copolymerized with an aliphatic group having a siloxane structure to such an extent that the heat resistance is not lowered. Particularly, for example, 1 to 10 mol % of bis(3-aminopropyl)tetramethyldisiloxane or bis(p-amino-phenyl)octamethylpentasiloxane can be copolymerized as a diamine component.

In the general formula (1), $R^3$ denotes a hydrogen or an organic group with 1 to 20 carbon atoms. In view of the solution stability of the obtained photosensitive resin precursor composition, it is preferred that $R^3$ denotes an organic group, but in view of dissolvability in the alkaline aqueous solution, hydrogen is preferred. In this invention, hydrogen atoms and alkyl groups can exist together. If the amounts of the hydrogen atoms and the organic groups of $R^3$s are adjusted, the rate of dissolving into the alkaline aqueous solution can be changed. So, if the adjustment is carried out, a photosensitive resin precursor composition having an adequate dissolution rate can be obtained. It is preferred that 10% to 90% of $R^3$s denote hydrogen atoms. $R^3$ with 20 or less carbon atoms gives an advantage that good alkali developability can be obtained. In view of the above, it is preferred that at least one of $R^3$s is a hydrocarbon group with 1 to 16 carbon atoms, and that the other $R^3$s denote respectively a hydrogen atom. Preferred examples of the hydrocarbon group as $R^3$ include a methyl group, ethyl group, propyl group, and butyl group.

Furthermore, in the general formula (1), m denotes the number of carboxyl groups, being an integer of 0 to 2. It is more preferred that m is selected from integers of 1 and 2. In the general formula (1), p and q denote, respectively independently, an integer of 0 to 4, subject to p+q>0. In the general formula (1), n denotes the recurring number of the structural units of the polymer of this invention, being in a range from 10 to 100000.

It is preferred that the polymer having one or more phenolic hydroxyl groups (a) used in the photosensitive resin composition of this invention contains the structural units represented by the general formula (1) as a main component. In this case, the main component means that the structural units represented by the general formula (1) are contained by 70 mol % or more. More preferred is 80 mol % or more, and the most preferred is 90 mol % or more. The polymer having one or more phenolic hydroxyl groups (a) used in this invention can also be a copolymer or mixture consisting of the structural units represented by the general formula (1) and other structural units, but it is preferred that the kind and amount of the structural units used for the copolymerization or mixing are selected to ensure that the heat resistance of the polymer obtained by the final heat treatment is not impaired.

Furthermore, in this invention, an end cap compound can be made to react with the ends of the polymer having the structural units represented by the general formula (1) as a main component. The end cap compound can be selected from monoamines, acid anhydrides, monocarboxylic acids, mono acid chloride compounds, mono active ester compounds, etc. It is preferred that the end cap compound is made to react, since the recurring number of the structural units, i.e., the molecular weight can be controlled in a preferred range. Moreover, if the end cap compound is made to react with the ends, various organic groups can be introduced as end groups. Preferred examples of the resin obtained by letting the end cap compound react with the polymer having the structural units represented by the general formula (1) include resins having any of the structures represented by the general formulae (10) to (13).

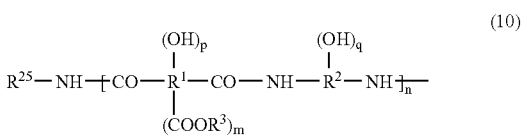

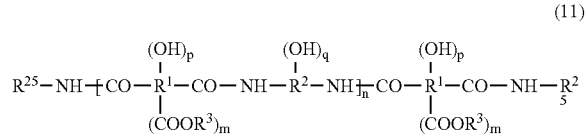

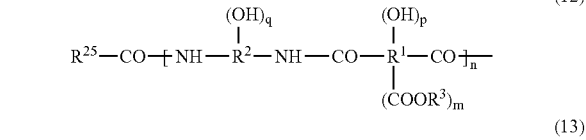

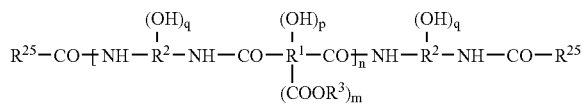

In the general formulae (10) and (11), —NH—$R^{25}$ is a component derived from a primary monoamine $NH_2$—$R^{25}$ used as the end cap compound. In the general formulae (12) and (13), —CO—$R^{25}$ is a component derived from the ring-opened addition product of an acid anhydride used as the end cap compound, monocarboxylic acid HOOC—$R^{25}$ or a compound obtained by converting the carboxyl group of a monocarboxylic acid into an acid chloride or active ester. $R^{25}$ denotes an organic group with 1 to 20 carbon atoms. It is preferred to contain at least one organic group selected from an ethynyl group, vinyl group, phenolic hydroxyl group, thiophenol group, carboxyl group, sulfone group, mercapto group, and hydroxyl group.

The monoamines usable as the end cap compound include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicyclic acid, 5-aminosalicyclic acid, 6-aminosalicyclic acid, 3-amino-O-toluic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonapthalene, 3,7-diethynyl-2-aminonaphthalene, 4,8-diethynyl-1-aminonaphthalene, 4,8-diethynyl-2-aminonaphthalene, etc., though not limited to them.

Among them, preferred are 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline, 3,5-diethynylaniline, etc.

The acid anhydrides, monocarboxylic acids, mono acid chloride compounds and active ester compounds usable as the end cap compound include acid anhydrides such as phthalic anhydride, maleic anhydride, nadic anhydride, cyclohexanedicarboxylic anhydride and 3-hydroxyphthalic anhydride, monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphtoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid, mono acid chloride compounds obtained by converting the carboxyl group of any of these monocarboxylic acids into an acid chloride, mono acid chloride compounds obtained by converting only the monocarboxyl group of such a dicarboxylic acid as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2-3-dicarboxynaphthalene, 2,6-dicarboxynaphthalene, or 2,7-dicarboxynaphthalene into an acid chloride, active ester compounds obtained by letting any of mono acid chloride compounds and N-hydroxybenzotriazole or N-hydroxy-5-norbornene-2,3-dicarboxyimide react with each other, etc.

Among them, preferred are acid anhydrides such as phthalic anhydride, maleic anhydride, nadic anhydride, cyclohexanedicarboxylic anhydride, and 3-hydroxyphthalic anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynapthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid, and 3,5-diethynylbenzoic acid, mono acid chloride compounds obtained by converting the carboxyl group of any of these monocarboxylic acids into an acid chloride, mono acid chloride compounds obtained by converting only the monocarboxyl group of such a dicarboxylic acid as terephthalic acid, phthalic acid, maleic acid, cyclohexanedicarboxylic acid, 1,5-dicarboxynaphthalene, 1,6-dicarboxynaphthalene, 1,7-dicarboxynaphthalene, or 2,6-dicarboxynaphthalene into an acid chloride, active ester compounds obtained by letting any of mono acid chloride compounds and N-hydroxybenzotriazole or N-hydroxy-5-norbornene-2,3-dicarboxyimide react with each other, etc.

It is preferred that the amount of the monoamine introduced as the end cap compound is in a range from 0.1 to 60 mol % based on the amount of all the amine components. An especially preferred range is from 5 to 50 mol %. It is preferred that the amount of the compound selected from acid anhydrides, monocarboxylic acids, mono acid chloride compounds and mono active ester compounds for introduction as the end cap compound is in a range from 0.1 to 100 mol % based on the amount of the diamine component. An especially preferred range is from 5 to 90 mol %. Plural end cap compounds can also be used for reaction to introduce plural kinds of end groups.

The end cap compound introduced into the polymer can be easily detected by the following method. For example, the polymer containing the introduced end cap compound is dissolved in an acid solution, for being decomposed into the amine component and the acid anhydride component that are structural units of the polymer. If they are measured by means of gas chromatography (GC) or NMR, the end cap compound can be easily detected. As another method, even if the polymer as an ingredient containing the end cap compound is directly measured by means of pyrolysis gas chromatograph (PGC), infrared spectroscopic analysis or $^{13}C$ NMR spectroscopic analysis, the end cap compound can be easily detected.

The polymer containing the structural units represented by the general formula (1) as a main component used in this invention can be synthesized by any one of the following methods: a method for producing a polyamic acid or a polyamic ester, in which a tetracarboxylic dianhydride and a diamine compound react with each other, for example, at a low temperature; a method in which a tetracarboxylic dianhydride and an alcohol are used to obtain a diester, and subsequently reaction with an amine is performed in the presence of a condensing agent; a method in which a tetracarboxylic dianhydride and an alcohol are used to obtain a diester, and subsequently the remaining dicarboxylic acid is converted into an acid chloride that is caused to react with an amine; a method in which a tetracarboxylic dianhydride and a diamine are selectively combined and made to react with each other in a polar solvent mainly containing N-methyl-2-pyrrolidone, N,N-dimethylacetamide, N,N-dimethylformamide, dimethyl sulfoxide, hexamethylphosphorotriamide or the like or in a solvent mainly containing γ-butyrolactone, and subsequently some of the carboxyl groups at the side chains are heat-treated for imidization or converted into an alkyl ester using an esterification reagent, etc.

Polyhydroxyamide can be obtained by a production method in which a bisaminophenol compound and a dicarboxylic acid are made to react with each other for condensation. Particular methods include the following: a method in which a dehydrating and condensing agent such as dicyclohexylcarbodiimide (DCC) and an acid are made to react with each other, and a bisaminophenol compound is added to the reaction product; a method in which a dicarboxylic acid dichloride solution is added dropwise to a bisaminophenol compound solution containing a tertiary amine such as pyridine; and so on. In the case where polyhydroxyamide is used, if a photosensitive material such as naphthoquinone diazide sulfonic ester is added to a polyhydroxyamide solution, a positive photosensitive resin precursor composition, the portion of which exposed to ultraviolet light can be removed by an alkaline aqueous solution, can be obtained.

In this invention, a compound having a phenolic hydroxyl group and containing only one group selected from a methylol group and alkoxymethyl group can be contained as the ingredient (b). The compound gives moderate alkali dissolvability, since it has a phenolic hydroxyl group. Furthermore, this compound has the following excellent feature. Since only either a methylol group or an alkoxymethyl group is contained, dehydration and addition occur between the methylol group or alkoxymethyl group and an aromatic ring in the polymer during curing, causing the compound to be added to the polymer, without causing the thermal decomposition and evaporation due to the heat acting during curing. So, compared with the case where a compound having a phenolic hydroxyl group only is added, the degree of shrinkage during curing can be kept small. In the case where a compound having a phenolic hydroxyl group only without having a methylol group and an alkoxymethyl group is added, the heat acting during curing decomposes and evaporate the compound having a phenolic hydroxyl group only. So, if the composition is cured, the degree of shrinkage of the film obtained from the composition becomes large. On the contrary, since the compound used as the ingredient (b) is not decomposed during curing after it has been added to the aromatic rings in the polymer, it gives an excellent effect in the degree of shrinkage caused in the film obtained from the composition. Since the degree of shrinkage during curing is kept small, the film not yet cured can have a small thickness, and as a result, the light energy is not absorbed by the film per se during exposure, and can easily reach the bottom of the film advantageously for obtaining higher photosensitivity.

Furthermore, in the case where a compound containing a phenolic hydroxyl group and further containing plural methylol groups or alkoxymethyl groups is added to the polymer as a known conventional technique (for example, used in the above-mentioned patent documents 1 to 3), since plural methylol groups or alkoxymethyl groups exist, they react with other molecules of the same compound containing a phenolic hydroxyl group and further containing plural methylol groups or alkoxymethyl groups, or react with the aromatic rings in other portions of the polymer, to cause intermolecular crosslinking of the polymer. If the degree of, crosslinking increases, good chemical resistance and mechanical characteristics can be exhibited, but on the other hand, especially when the film is as thick as 10 μm or more, the shrinkage stress of the film increases to cause such problems as pattern distortion and deformation. Furthermore, the increase in the degree of crosslinking causes a problem that the mechanical characteristics of the cured film are remarkably lowered on the contrary.

If the compound as the ingredient (b) of this invention is used, the compound is added to the aromatic rings in the polymer, and thereafter neither decomposition nor crosslinking occurs during curing. So, it gives an advantage that the photosensitivity can be enhanced by increasing the added amount of it while the degree of shrinkage is kept small and while the alkali dissolvability is kept moderate. Moreover, it is preferred that the compound as the ingredient (b) of this invention is used together with a compound containing a phenolic hydroxyl group and further containing plural methylol groups or alkoxymethyl groups, since the ingredient (b) gives an effect of allowing alkali dissolution and an effect of preventing the decomposition and evaporation during curing and also gives an effect of enhancing the photosensitivity and lowering the degree of shrinkage without causing pattern distortion and deformation, compared with the case where only the compound containing a phenolic hydroxyl group and further containing plural methylol groups or alkoxymethyl groups is used for causing crosslinking reaction only to progress. In the case where both the compounds are used together, it is preferred that the content of the compound containing a phenolic hydroxyl group and further containing plural methylol groups or alkoxymethyl groups is in a range from 0.5 to 10 parts by weight per 100 parts by weight of the polymer having one or more phenolic hydroxyl groups (a) or in a range from 0.2 to 17 parts by weight per 100 parts by weight of the composition, since the pattern distortion and deformation due to the film shrinkage does not occur in this range.

If a monomethylol compound having a phenolic hydroxyl group is used, a larger dissolution promoting effect can be obtained during development. On the other hand, in view of the storage stability of the composition, a monoalkoxymethyl compound having a phenolic hydroxyl group is more preferred.

Examples of the compound having a phenolic hydroxyl group and containing only one group selected from a methylol group and alkoxymethyl group (b) include the following.

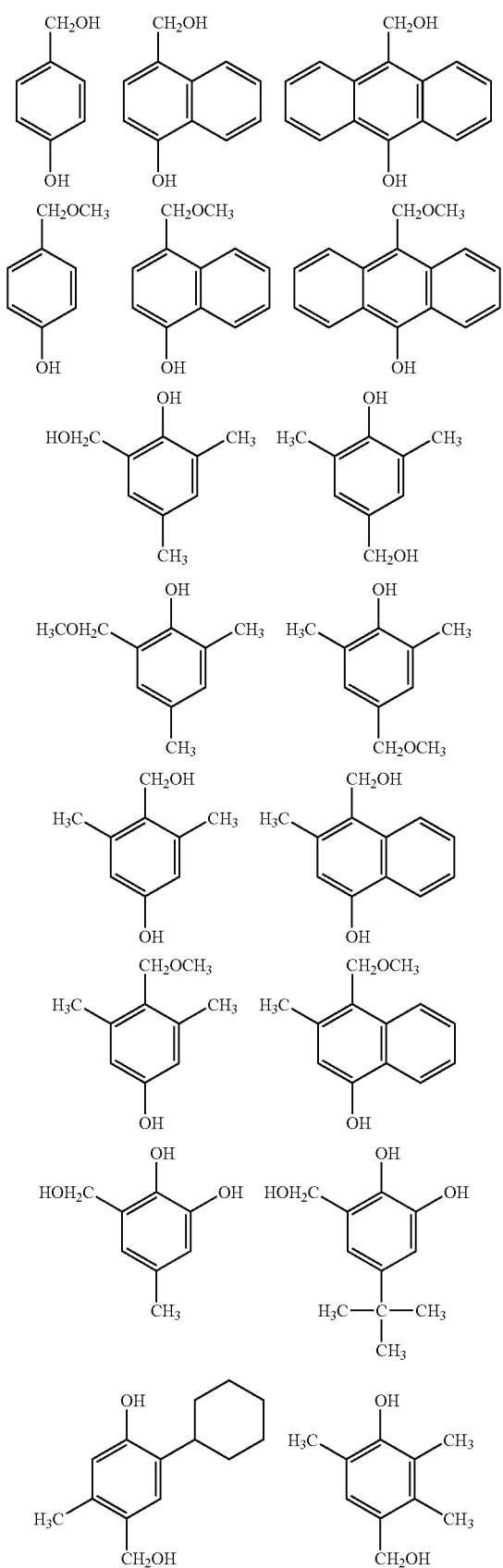

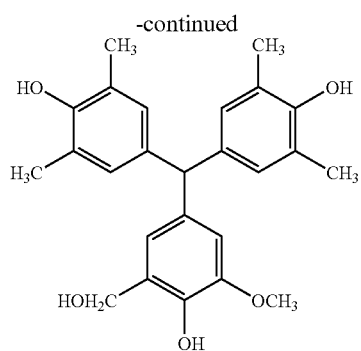

More preferred examples have the structure represented by the following general formula (5).

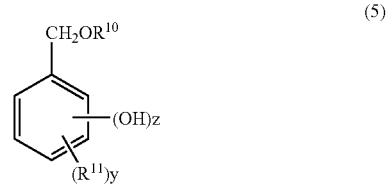

In the general formula (5), $R^{10}$ denotes an organic group with 1 to 20 carbon atoms, preferably an alkyl group with 1 to 4 carbon atoms. An organic group with 20 or less carbon atoms gives an advantage that the degree of shrinkage during curing is small. $R^{11}$ denotes an organic group with 1 to 20 carbon atoms having at least one functional group selected from an alkyl group, vinyl group, ester group, amide group, ethynyl group, phenoxy group, sulfone group, thioether group, phenyl group, fluoroalkyl group and ketone group, fluorine or alkoxy group with 1 to 20 carbon atoms. Symbol y denotes an integer of 0 to 4. To keep the degree of shrinkage during curing low, it is preferred that y denotes 0 or 1, more preferably 0. Symbol z denotes an integer of 1 to 5, subject to $y+z \leqq 5$.

Among the examples of the compound represented by the general formula (5), the following are more preferred.

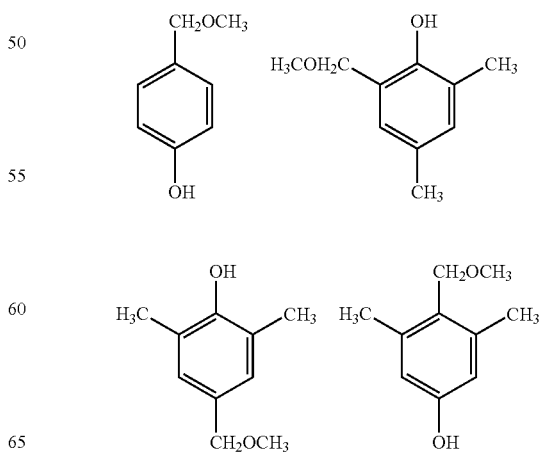

It is preferred that the content of the compound having a phenolic hydroxyl group and containing one group selected from a methylol group and alkoxymethyl group (b) is from 0.5 to 50 parts by weight per 100 parts by weight of the polymer having one or more phenolic hydroxyl groups (a). A more preferred range is from 3 to 40 parts by weight. The content of the compound (b) in this range gives an advantage that good mechanical characteristics can be obtained.

In this invention, a photo acid generator is used as the ingredient (c). Examples of the photo acid generator include quinone diazide compounds, sulfonium salts, phosphonium salts, diazonium salts, etc. In this invention it is more preferred to use two or more of these photo acid generators in combination. At least one of them is intended to exhibit positive photosensitivity, and at least another one of them is intended to moderately stabilize the acid component generated when the photo acid generator exhibiting the positive photosensitivity is exposed, for efficiently decomposing the photosensitive material to enhance the photosensitivity. Using plural photo acid generators in combination gives an advantage that the photosensitivity can be remarkably enhanced.

It is preferred that the photo acid generator capable of exhibiting positive photosensitivity is a quinone diazide compound. For example, said quinone diazide compound has the sulfonic acid of the quinone diazide bonded as an ester to a polyhydroxy compound, or has the sulfonic acid of the quinone diazide sulfonamide-bonded to a polyamino compound, or has the sulfonic acid of the quinone diazide ester-bonded and/or sulfonamide-bonded to a polyhydroxy-polyamino compound. It is not necessary that all the functional groups of the polyhydroxy compound or polyamino compound are substituted by the quinone diazide, but it is preferred that 50 mol % or more of all the functional groups are substituted by the quinone diazide. If 50 mol % or more of all the functional groups are substituted by the quinone diazide, the dissolvability in an alkaline developer becomes good to give an advantage that a fine pattern with high contrast to the non-exposed area can be obtained. If such a quinone diazide compound is used, a positive photosensitive resin composition sensitive to the i-line (365 nm), h-line (405 nm) or g-line (436 nm) of a mercury lamp as general ultraviolet light can be obtained.

Examples of the polyhydroxy compound include Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26x, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (respectively trade names, produced by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (respectively trade names, produced by Asahi Organic Chemicals Industry Co., Ltd.), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, BisP-AP (trade name, produced by Honshu Chemical Industry Co., Ltd.), etc., though not limited to them.

Examples of the polyamino compound include 1,4-phenylenediamine, 1,3-phenylenediamine, 4,4'-diaminodiphenyl ether, 4,4'-diaminodiphenylmethane, 4,4'-diaminodiphenylsulfone, 4,4'-diaminodiphenyl sulfide, etc., though not limited to them.

Furthermore, examples of the polyhydroxypolyamino compound include 2,2-bis(3-amino-4-hydroxyphenyl) hexafluoropropane, 3,3'-dihydroxybenzidine, etc., though not limited to them.

In this invention, as the quinone diazide, either a 5-naphthoquinone diazide sulfonyl group or 4-naphthoquinone diazide sulfonyl group can be preferably used. A 4-naphthoquinone diazide sulfonyl ester compound shows absorption in the i-line region of a mercury lamp and is suitable for i-line exposure. A 5-naphthoquinone diazide sulfonyl ester compound shows extended absorption up to the g-line region of a mercury lamp and is suitable for g-line exposure. In this invention, it is preferred to select either a 4-naphthoquinone diazide sulfonyl ester compound or a 5-naphthoquinone diazide sulfonyl ester compound depending on the wavelength used for exposure. Furthermore, a naphthoquinone diazide sulfonyl ester compound containing both a 4-naphthoquinone diazide sulfonyl group and a 5-naphthoquinone diazide sulfonyl group in the same molecule can also be obtained, or a 4-napthoquinone diazide sulfonyl ester compound and a 5-naphthoquinone diazide sulfonyl ester compound can also be used as a mixture.

It is preferred that the molecular weight of the quinone diazide compound is from 300 to 1500. A more preferred range is from 350 to 1200. A molecular weight of 300 or more gives an advantage that the exposure sensitivity becomes high, and a molecular weight of 1500 or less gives an advantage that the mechanical characteristics of the film after thermal curing are improved.

The quinone diazide compound used in this invention can be synthesized from a specific phenol compound by the following method. In this method, for example, 5-naphthoquinone diazide sulfonyl chloride and a phenol compound are made to react with each other in the presence of triethylamine. The method for producing a phenol compound can be, for example, a method in which an α-(hydroxyphenyl)styrene derivative is made to react with a polyhydric phenol compound in an acid catalyst.

With regard to the photo acid generator used as the ingredient (c) of this invention, if it is used for moderately stabilizing the acid component generated by exposure, it is preferred to use a compound selected from sulfonium salts, phosphonium salts, and diazonium salts. Since the resin composition film obtained from the photosensitive resin composition of this invention is used as a permanent film, a structure free from remaining phosphorus or the like is preferred in view of environment. Furthermore, the color tone of the film must also be taken into account. So, among the above-mentioned compounds, sulfonium salts can be preferably used. Among the sulfonium salts, structures represented by general formulae (2) to (4) can be preferably used.

(2)

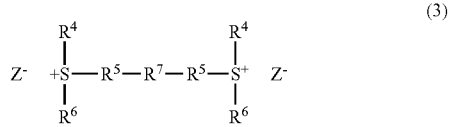

(3)

-continued

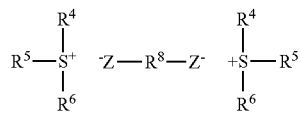
(4)

In the general formulae (2) to (4), $R^4$ to $R^6$ denote, respectively independently, an organic group with 1 to 20 carbon atoms. $R^7$ and $R^8$ denote, respectively independently, a single bond or an organic group with 1 to 20 carbon atoms. $Z^-$ denotes an anion portion selected from $R^9SO_3^-$, $R^9COO^-$, and $SbF_6^-$. $R^9$ denotes an organic group with 1 to 20 carbon atoms. Examples of the sulfonium salt represented by the general formula (2) are enumerated below, though not limited to them.

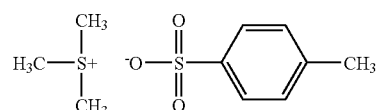

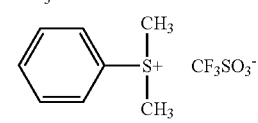

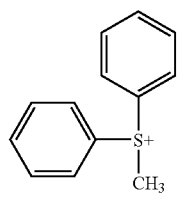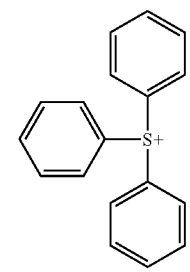

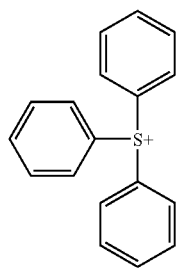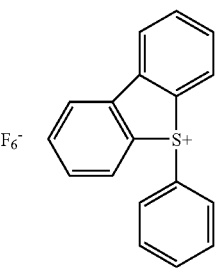

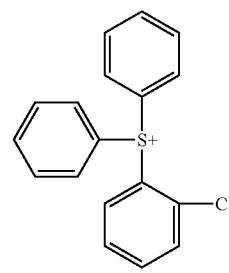

-continued

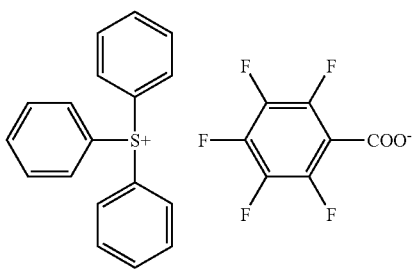

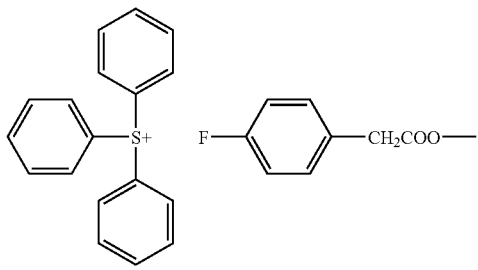

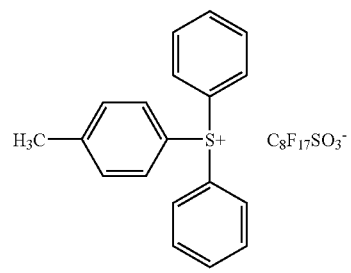

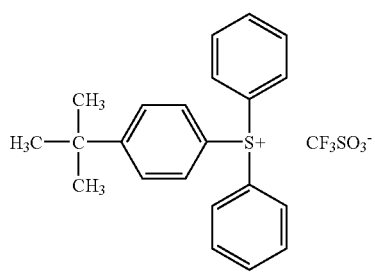

-continued
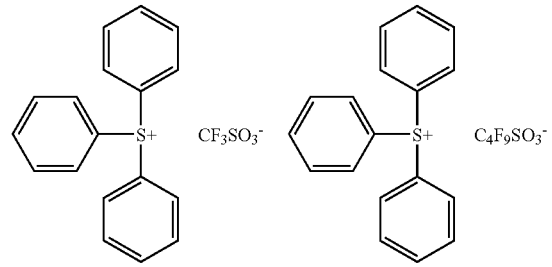
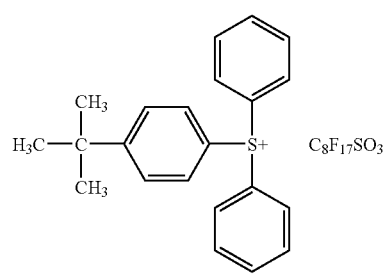
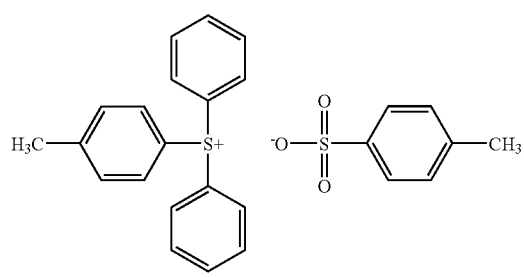
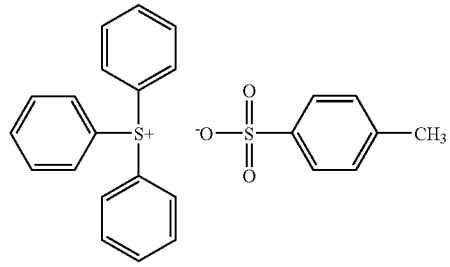
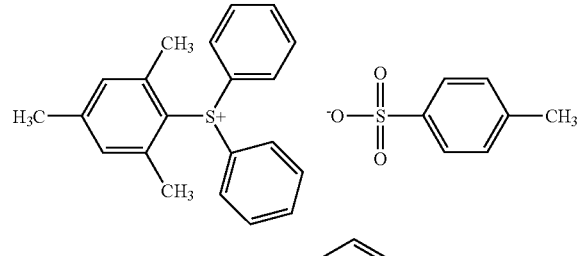
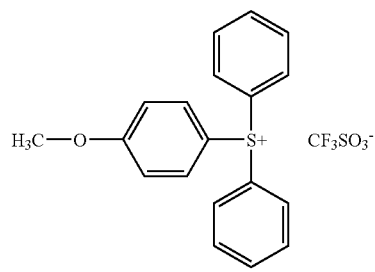
-continued
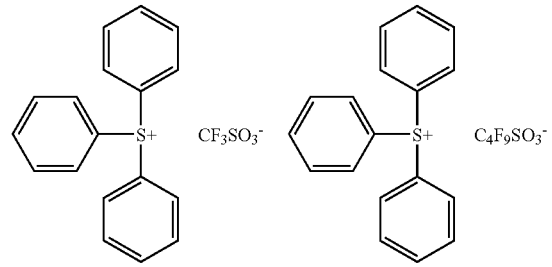
Examples of the sulfonium salt represented by the general formula (3) are enumerated below, though not limited to them.

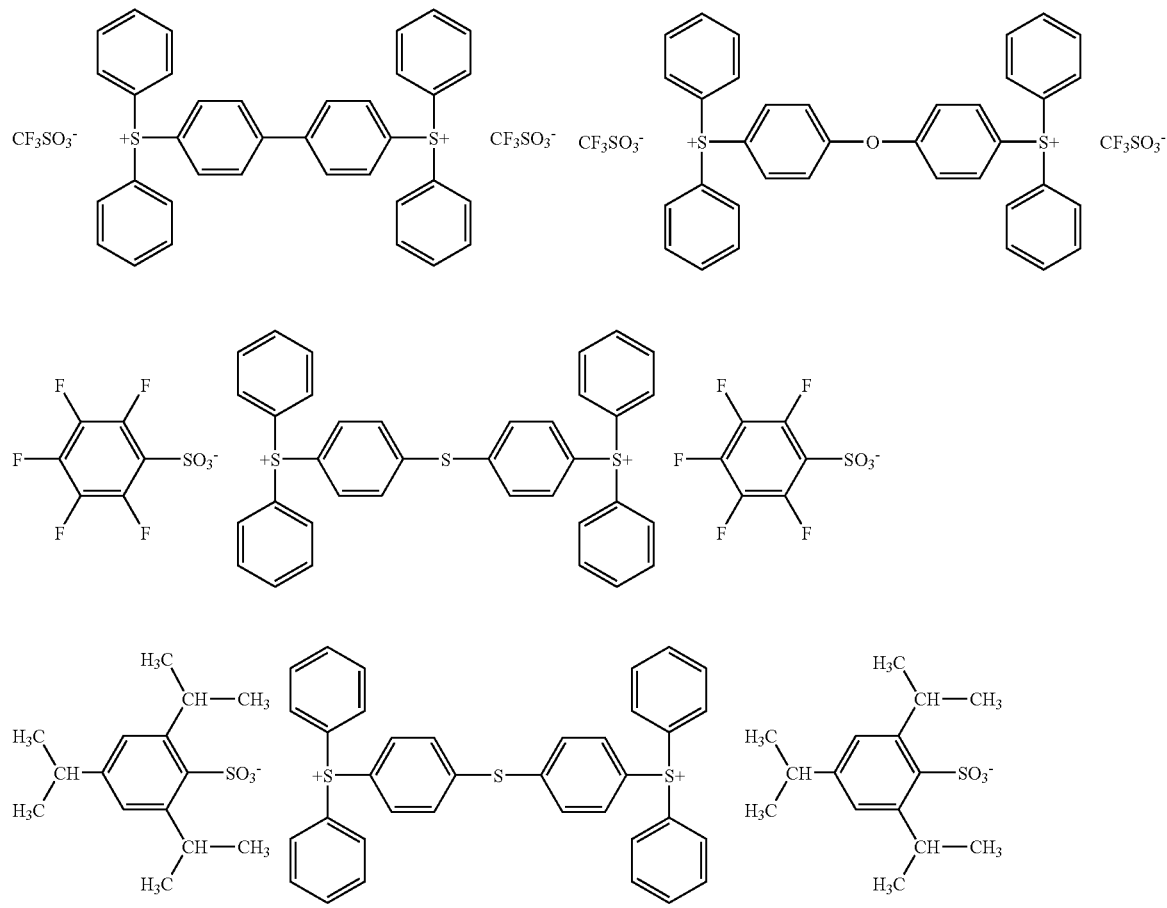
Examples of the sulfonium salt represented by the general formula (4) are enumerated below, though not limited to them.
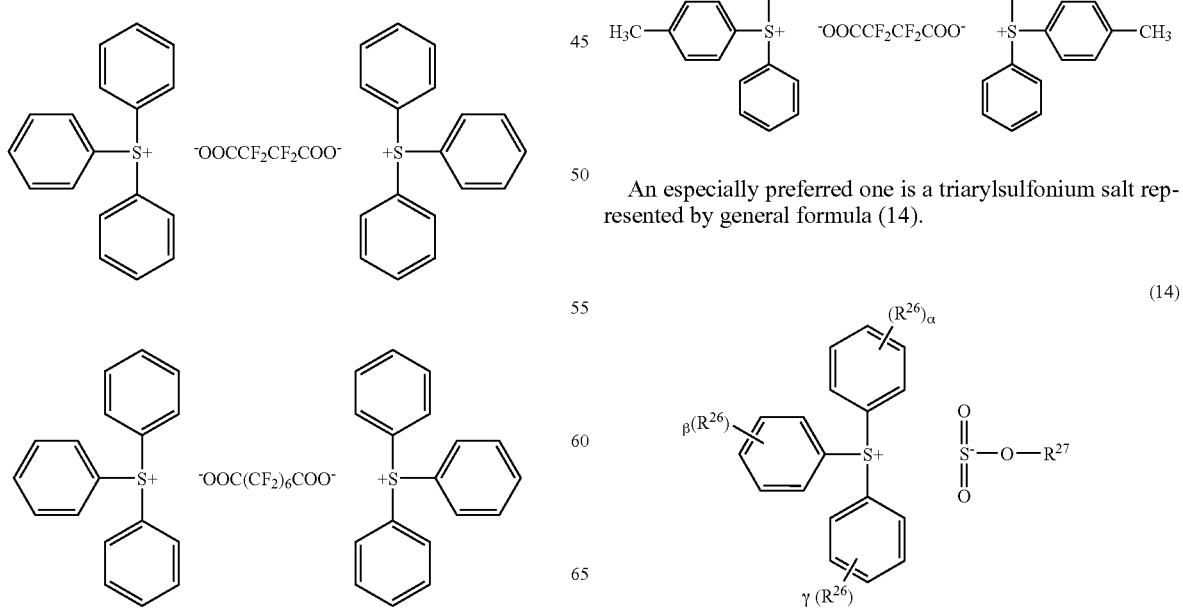
An especially preferred one is a triarylsulfonium salt represented by general formula (14).

In the general formula (14), $R^{26}$ denote, respectively independently, a hydrogen or organic group with 1 to 20 carbon atoms. $R^{27}$ denotes an organic group with 0.1 to 20 carbon atoms. Symbols α, β and γ denote, respectively independently, an integer of 0 to 5.

Examples of the triarylsulfonium salt represented by the general formula (14) are enumerated below, though not limited to them.

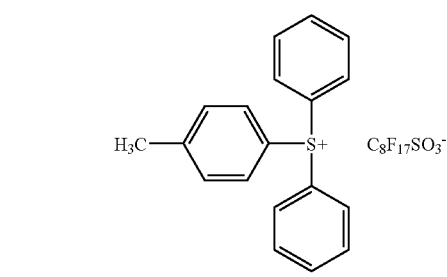

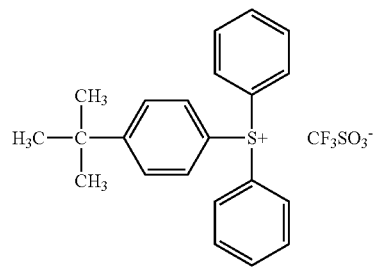

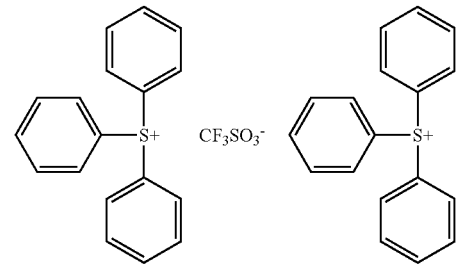

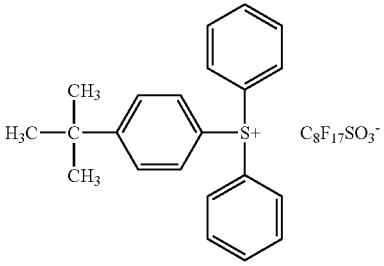

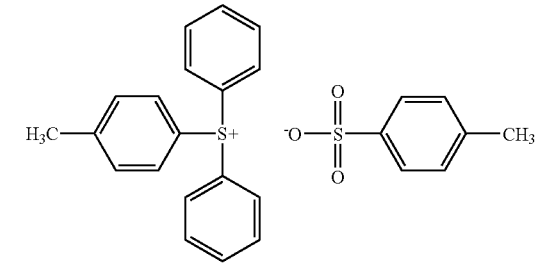

-continued

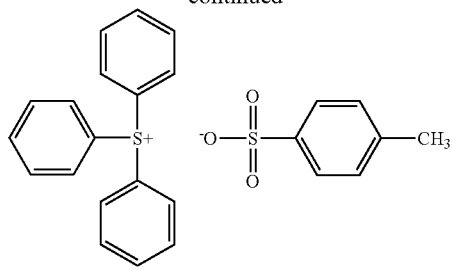

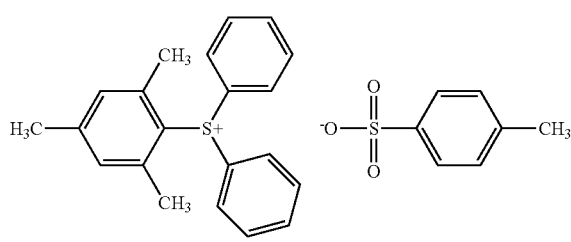

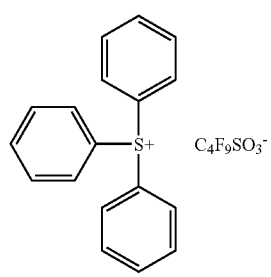

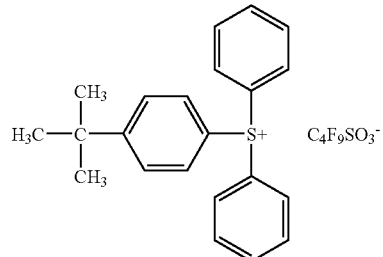

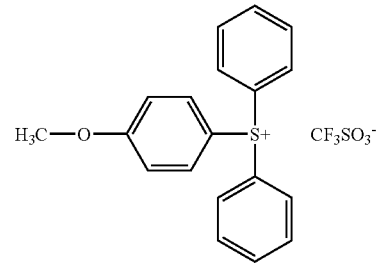

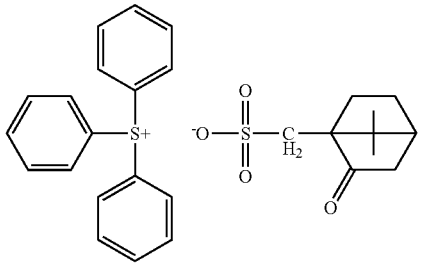

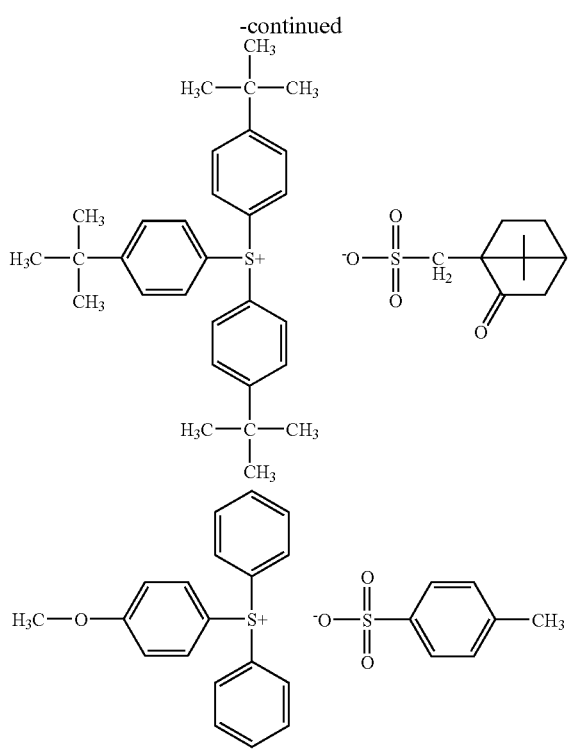

It is preferred that the content of the photo acid generator used as the ingredient (c) of this invention is from 0.01 to 50 parts by weight per 100 parts by weight of the polymer having one or more phenolic hydroxyl groups (a). Among the photo acid generators, it is preferred that the content of the quinone diazide compound is from 1 to 50 parts by weight. A more preferred range is from 3 to 40 parts by weight. Furthermore, it is preferred that the content of all the compounds selected from sulfonium salts, phosphonium salts, and diazonium salts is in a range from 0.05 to 40 parts by weight, and a more preferred range is from 0.3 to 30 parts by weight. If the content is kept in the corresponding range, a higher photosensitivity can be achieved.

For the purpose of improving the adhesion to the substrate, the photosensitive resin composition of this invention may also contain, as required, a compound represented by the following general formula (15) or (16) or a vinylsilane compound.

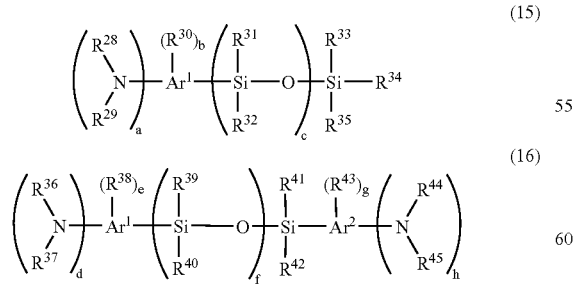

In the general formulae (15) and (16), $Ar^1$ and $Ar^2$ denote, respectively independently, an aromatic ring with 6 or more carbon atoms or an aromatic heterocyclic structure with 2 or more carbon atoms. Examples of the aromatic ring with 6 or more carbon atoms or the aromatic heterocyclic structure with 2 or more carbon atoms include phenyl group, naphthalene-group, biphenyl group, triazine group, pyridine group or the like, though not limited to them.

In the general formulae (15) and (16), $R^{28}$, $R^{29}$, $R^{36}$, $R^{37}$, $R^{44}$ and $R^{45}$ denote, respectively independently, a hydrogen or organic group with 1 to 4 carbon atoms. Examples of the organic group with 1 to 4 carbon atoms include hydrocarbon groups such as a methyl group, ethyl group and propyl group, carbonyl groups such as an acetyl group. It should be noted that if the number of carbon atoms is 5 or more, the film shrinkage during curing becomes large. $R^{30}$, $R^{38}$, and $R^{43}$ denote, respectively independently, an organic group with 1 to 6 carbon atoms, and $R^{31}$ to $R^{35}$ and $R^{39}$ to $R^{42}$ denote, respectively independently, a hydrocarbon group with 1 to 6 carbon atoms, alkoxy group with 1 to 6 carbon atoms, or phenyl group. Furthermore, at least one of $R^{31}$ to $R^{35}$ and $R^{39}$ to $R^{42}$ denotes an alkoxy group with 1 to 6 carbon atoms. Examples of the hydrocarbon group include a methyl group, ethyl group, and propyl group, though not limited to them. Examples of the alkoxy group include a methoxy group, ethoxy group, n-propoxy group, isopropoxy group, n-butoxy group, and isobutoxy group, though not limited to them. A hydrocarbon group or alkoxy group with 6 or less carbon atoms gives an advantage that the film shrinkage during curing can be kept small. Preferred examples of the compound include the following structures, though not limited to them.

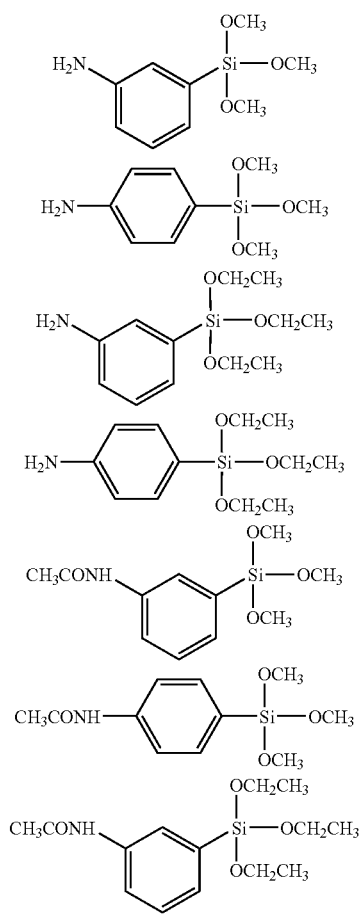

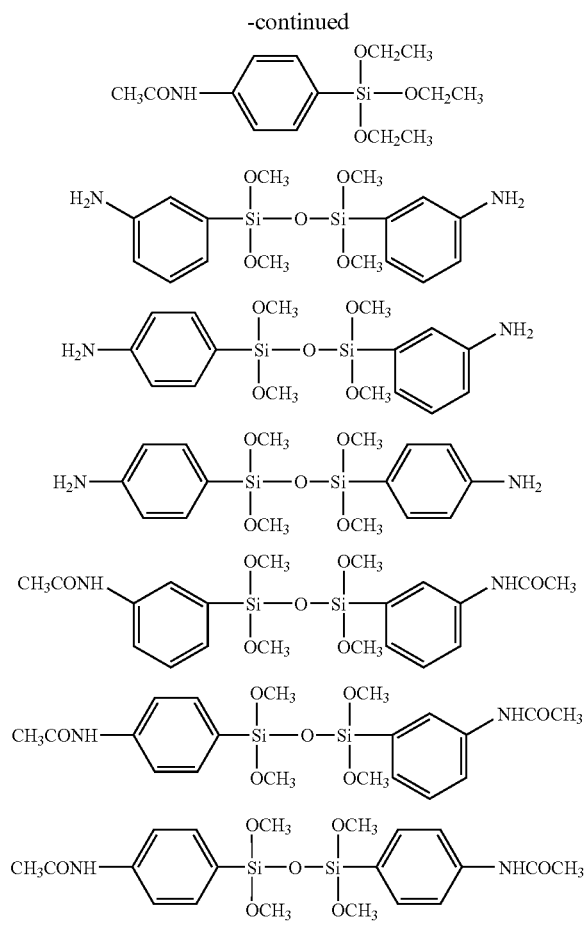

Above all, the following structures are most preferred.

Furthermore, examples of the vinylsilane compound include vinyltrimethoxysilane, vinyltriethoxysilane, vinyltrichlorosilane, vinyltris(β-methoxyethoxy)silane, etc. Moreover, a carbon-carbon unsaturated bond-containing silane compound such as 3-methacryloxypropyltrimethoxysilane, 3-acryloxypropyltrimethoxysilane, p-styryltrimethoxysilane, 3-methacryloxypropylmethyldimethoxysilane, or 3-methacryloxypropylmethyldiethoxysilane can also be used. Preferred are vinyltrimethoxysilane, and vinyltriethoxysilane.

Any one of the compounds represented by the general formulae (15) and (16) and vinylsilane compounds can be used, or two or more of them can also be used together. In either case, the photosensitive resin composition exhibits good adhesion to various substrates.

It is preferred that the content of the compounds represented by the general formulae (15) and (16) and vinylsilane compounds is from 0.001 to 30 parts by weight per 100 parts by weight of the polymer having one or more phenolic hydroxyl groups (a). A more preferred range is from 0.005 to 20 parts by weight, and a further more preferred range is from 0.01 to 15 parts by weight. The content kept in this range gives an advantage that both good adhesion promoting effect and good heat resistance can be achieved.

Furthermore, in this invention, it is preferred to add any compound selected from the compounds represented by the general formulae (15) and (16) and the vinylsilane compounds to the polymer compound after completion of polymerization. If the compound is added after completion of polymerization, a good adhesion effect can be sustained since the compound is not incorporated as covalent bonds in the polymer. Moreover, in the case where the polymer is obtained by reprecipitation, it is preferred to add the compound when or after the reprecipitated polymer is redissolved in the solvent, lest such problems that the unreactive matter or the like of said compound is removed at the time of reprecipitation to lower the adhesion effect and that the gelation is caused by the condensation of alkoxy groups should occur.

Furthermore, as required, said photosensitive resin composition can also contain a solubility speed enhancer for enhancing the photosensitivity of the photosensitive resin composition, to such an extent that the degree of shrinkage during curing does not become large. As the solubility speed enhancer, any compound used generally as a solubility speed enhancer for positive resists, such as a polyhydroxy compound, sulfonamide compound or urea compound can be preferably used. Especially, a polyhydroxy compound as a raw material used for synthesizing a quinone diazide compound can be preferably used. Preferred examples of the polyhydroxy compound include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26x, BIP-PC, BIR-PC, BIR-PTBP, BIR-BIPC-F, etc. Among them, especially preferred examples of the polyhydroxy compound are Bis-Z, TekP-4HBPA, TrisP-HAP, TrisP-PA, BisRS-2P, BisRS-3P, BIR-PC, BIR-PTBP, and BIR-BIPC-F. If the obtained resin composition contains this compound having phenolic hydroxyl groups, it is little dissolved in the alkaline developer before exposure and is easily dissolved in the alkaline developer after exposure. So, the film reduction due to development is small, and development can be accomplished easily within a short period of time.

It is preferred that the amount of the solubility speed enhancer is from 1 to 100 parts by weight per 100 parts by weight of the polymer having one or more phenolic hydroxyl groups (a). A more preferred range is from 5 to 40 parts by weight. A content of 1 part by weight or more gives advantages that the development can be accomplished in a shorter period of time and that exposure sensitivity is also high. A content of 100 parts by weight or less gives an advantage that the heat resistance of the film after thermal curing is improved.

Furthermore, as required, for the purpose of improving the wettability between the photosensitive resin composition and the substrate, a surfactant, ester such as ethyl lactate or propylene glycol monomethyl ether acetate, alcohol such as ethanol, ketone such as cyclohexanone or methyl isobutyl ketone, or ether such as tetrahydrofuran or dioxane can also be mixed. Moreover, inorganic particles of silicone dioxide, titanium dioxide or the like, polyimide powder or the like can also be contained.

Furthermore, for enhancing the adhesion to the underlying substrate such as a silicon wafer, the underlying substrate can also be pretreated using any of the compounds represented by the general formula (15) or (16) or a vinylsilane compound. In this case, a solution obtained by dissolving 0.5 to 20 wt % of said compound in a solvent such as isopropanol, ethanol, methanol, water, tetrahydrofuran, propylene glycol monomethyl ether acetate, propylene glycol monomethyl ether, ethyl lactate or diethyl adipate is used to treat the surface by means of spin coating, immersion, spray coating, vapor treatment, etc. As the case may be, the treated substrate is heated at a temperature of 50° C. to 300° C., for letting the reaction between the substrate and said adhesion promoting ingredient progress.

The photosensitive resin composition of this invention can contain, as required, a colorant for the purpose of coloring the heat resistant resin film after completion of heat treatment. The colorant can be a dyestuff, organic pigment, inorganic pigment or heat-sensitive color-forming compound capable of forming a color when heated.

As the dyestuff, preferred is a dyestuff soluble in the organic solvent capable of dissolving the polymer having one or more phenolic hydroxyl groups (a) and compatible with the resin. Preferred examples of the dyestuff include oil soluble dyestuffs, disperse dyestuffs, reactive dyestuffs, acid dyestuffs, direct dyestuffs, etc. In view of skeletal structures, the dyestuffs include anthraquinone-based dyestuffs, azo-based dyestuffs, phthalocyanine-based dyestuffs, methine-based dyestuffs, oxazine-based dyestuffs, and these dyestuffs respectively containing any metal complex salt. Among them, phthalocyanine dyestuffs and metal complex salt-containing dyestuffs are preferred in view of excellent heat resistance and light resistance. Particular examples include Sumilan and Lanyl dyestuffs (respectively produced by Sumitomo Chemical Industry Co., Ltd.), Orasol, Oracet, Filamid and Irgasperse dyestuffs (respectively produced by Chiba Speciality Chemicals Co., Ltd.), Zapon, Neozapon, Nepture and Acidol dyestuffs (respectively produced by BASF), Kayaset and Kayakalan dyestuffs (respectively produced by Nippon Kayaku, Co., Ltd.), Valifast colors dyestuff (produced by Orient Chemical Co., Ltd.), Savinyl, Sandoplast, Polysynthren and Lanasyn dyestuffs (respectively produced by Clariant Japan Co., Ltd.), Aizen Spilon dyestuff (produced by Hodogaya Chemical Co., Ltd.), etc. Any one of these dyestuffs can be used, or two or more of them can also be used as a mixture.

As the organic pigment, preferred is a pigment with high color formability and high heat resistance. Especially a carbon black and/or a combination consisting of two or more organic pigments are preferred. Examples of the carbon black include furnace blacks such as HCF, MCF, LFF, RCF, SAF, ISAF, HAF, XCF, FEF, GPF and SRF, thermal blacks such as FT and MT, channel black, acetylene black, etc. Any one of these carbon blacks can be used, or two or more of them can also be used as a mixture.

As the organic pigment used in this invention, an organic pigment with excellent heat resistance is preferred. Typical examples of the pigment are shown below as color index (CI) numbers. Examples of yellow pigment include Pigment Yellow 12, 13, 14, 17, 20, 24, 31, 55, 83, 86, 93, 94, 109, 110, 117, 125, 137, 138, 139, 147, 148, 150, 153, 154, 155, 166, 168, 173, 180, 185, etc. Examples of orange pigment include Pigment Orange 13, 31, 36, 38, 40, 42, 43, 51, 55, 59, 61, 64, 65, 71, etc. Examples of red pigment include Pigment Red 9, 97, 122, 123, 144, 149, 166, 168, 176, 177, 180, 190, 192, 209, 215, 216, 224, 242, 254, etc. Examples of violet pigment include Pigment Violet 19, 23, 29, 32, 33, 36, 37, 38, etc. Examples of blue pigment include Pigment Blue 15 (15:3, 15:4, 15:6, etc.), 21, 22, 60, 64, etc. Examples of green pigment include Pigment Green 7, 10, 36, 47, etc.

As the inorganic pigment, an insulating metal compound is preferred. If an inorganic pigment poor in electric insulation is used, the function as a dielectric film is insufficient. For example, in the case where an electro-luminescent element of an organic electro-luminescent display is produced, electric short circuit or the like occurs to cause a serious problem. Examples of the insulating metal compound include manganese oxide, titanium oxide, titanium oxide nitride, chromium oxide, vanadium oxide, iron oxide, cobalt oxide, niobium oxide, etc. Especially manganese oxide and titanium oxide nitride can be suitably used in this invention. The manganese oxide generally has a composition of $Mn_xO_y$ ($1 \leq x < y \leq 5$). Particularly, it includes $\gamma$-$MnO_2$, $\beta$-$MnO_2$, $\alpha$-$MnO_2$, $Mn_2O_3$, $Mn_3O_4$, etc., and furthermore, amorphous $Mn_xO_y$ ($1 \leq x < y \leq 5$) can also be used. It is preferred that the primary particle size of the manganese oxide powder is 100 nm or less. More preferred is 60 nm or less. The primary particle size can be obtained by arithmetical averaging using an electron microscope.

The titanium oxide nitride suitably used in this invention generally has a composition of $TiN_\alpha O_\beta$ ($0 < \alpha < 2, 0.1 < \beta < 2$). It is preferred that the primary particle size of the titanium oxide nitride is 100 nm or less like the manganese oxide. More preferred is 60 nm or less.

The heat-sensitive color-forming compound capable of forming a color when heated can be a general thermosensitive pigment or pressure sensitive pigment, or any other compound. The heat-sensitive color-forming compound can be a compound capable of forming a color since an acid group existing together in it acts to change its chemical structure or charged state when heated, or a compound capable of forming a color since thermal oxidation reaction or the like is caused in the presence of the oxygen in air. Examples of the skeletal structure of the heat-sensitive color-forming compound include a triarylmethane structure, diarylmethane structure, fluoran structure, bislactone structure, phthalide structure, xanthene structure, rhodamine lactam structure, fluorene structure, phenothiazine structure, phenoxazine structure, spiropyran structure, etc. Particular examples of the heat-sensitive color-forming compound include 4,4',4''-tris(dimethylamino)triphenylmethane, 4,4',4''-tris(diethylamino)-2,2',2''-trimethyltriphenylmethane, 2,4',4''-methylidene trisphenol, 4,4',4''-methylidene trisphenol, 4,4'-[(4-hydroxyphenyl)methylene]bis(benzeneamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(3-hydroxyphenyl)methylene]bis[2,6-dimethylphenol], 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(3-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[3,4-dihydroxyphenyl]methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4'',4'''-(1,2-ethanediylidene)tetrakisphenol, 4,4',4'',4'''-(1,2-ethanediylidene)tetrakis[2-methylphenol], 4,4',4'',4'''-(1,2-ethanediylidene)tetrakis[2,6-dimethylphenol], 4,4',4'',4'''-(1,4-phenylenedimethylidene)tetrakisphenol, 4,4',4'',4'''-(1,4-phenylenedimethylidene)tetrakis(2,6-dimethylphenol), 4,4'-[(2-hydroxyphenyl)methylene]bis[3-methylphenol], 2,2'-[(3-hydroxyphenyl)methylene]bis[3,5-dimethylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl)methylene]bis[3,5-dimethylphenol], 2,2'-[(3-hydroxy-4-methoxyphenyl)methylene]bis[3,5-dimethylphenol], 4,4'-[(2-hydroxyphenyl)methylene]bis[2-methylethylphenol], 4,4'-[(3-hydroxyphenyl)methylene]bis[2-methylethylphenol], 4,4'-[(4-hydroxyphenyl)methylene]bis[2-methylethylphenol], 2,2'-[(3-hydroxyphenyl)methylene]bis[3,5,6-trimethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl) phenol], 4,4'-[(3-hydroxy-4-methoxyphenyl)methylene]bis[2-(methylethyl) phenol], 4,4'-[(4-hydroxy-3-methoxyphenyl)methylene]bis[2-(methylethyl) phenol], 2,2'-[(2-hydroxy-3-methoxyphenyl)methylene]bis[3,5,6-trimethyl phenol], 2,2'-[(3-hydroxy-4-methoxyphenyl)methylene]bis[3,5,6-trimethyl phenol], 2,2'-[(4-hydroxy-3-methoxyphenyl)methylene]bis[3,5,6-trimethyl phenol], 4,4'-[(4-hydroxy-3-ethoxyphenyl)methylene]bis[2-(methylethyl)phenol], 2,2'-[4-hydroxy-3-ethoxyphenyl]methylene]bis[3,5,6-trimethylphenol], 4,4'-[(4-hydroxy-3-ethoxyphenyl)methylene)bis[2,3,6-trimethylphenol], 4,4'-[(4-hydroxy-3-methoxyphenyl)methylene]bis[2-(1,1-dimethyl ethyl)-5-methylphenol], 4,4'-[(2-hydroxyphenyl)methylene]bis[2-cyclohexylphenol], 4,4'-[(3-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(3-hydroxy-4-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4,4'-methylidenetris[2-cyclohexyl-5-methylphenol], 2,2'-[(3,4-dihydroxyphenyl)methylene]bis[3,5-dimethylphenol], 4,4'-[3,4-dihydroxyphenyl]methylene]bis[2-(methylethyl) phenol], 2,2'-[(3,4-dihydroxyphenyl)methylene]bis[3,5,6-trimethylphenol], 4,4'-(3,4-dihydroxyphenyl)methylene]bis[2-cyclohexylphenol], 3,3'-[(2-hydroxphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4-hydroxy-6-methylphenyl)]methyl]phenol, 4,4'-(3,5-dimethyl-4-hydroxyphenylmethylene)-bis(2,6-dimethylphenol), 3,3-bis(p-dimethylaminophenyl)-6-dimethylaminophthalide, 3,6-bis(dimethylamino)fluoran-γ-(4'-nitro)-aminolactam, 2-(2-chloroanilino)-6-diethylaminofluoran, 2-(2-chloroanilino)-6-dibutylaminofluoran, 2-N,N-dibenzylamino-6-diethylaminofluoran, 6-diethylamino-benzo[a]-fluoran, 2,2'-bis(2-chlorophenyl)-4,4',5,5'-tetraphenyl-1,2'-bis (imidazole), 1,3-dimethyl-6-diethylaminofluoran, 2-anilino-3-methyl-6-dibutylaminofluoran, 3,7-bis(dimethylamino)-10-benzoylphenothiazine, 3-diethylamino-6-chloro-7-(β-ethoxyethylamino)fluoran, 3-diethylamino-6-methyl-7-anilinofluoran, 3-triethylamino-6-methyl-7-anilinofluoran, 3-cyclohexylamino-6-methyl-7-anilinofluoran, etc.

Among them, a hydroxyl group-containing compound having a triarylmethane structure is especially preferred, since it is high in heat sensitive temperature and excellent in heat resistance. Any one of them can be used or two or more of them can also be used as a mixture. Meanwhile, a hydroxyl group-containing compound having a triarylmethane structure can also have a naphthoquinone diazide sulfonic acid ester-bonded to it, for use as a quinone diazide compound.

It is preferred that the content of the colorant used in this invention is from 1 to 300 parts by weight per 100 parts by weight of the polymer having one or more phenolic hydroxyl groups (a). An especially preferred range is from 10 to 200 parts by weight. A colorant content of 300 parts or less gives an advantage that the adhesive strength between the photosensitive resin film and the substrate is good.

In the case where a colorant is used in the photosensitive resin composition of this invention, it can be considered to use one dyestuff or organic pigment, or to use two or more dyestuffs or organic pigments as a mixture, or to use one or more dyestuffs and one or more organic pigments in combination, or to use one or more heat-sensitive color-forming compounds and one or more dyestuffs in combination, or to use one or more inorganic pigments and one or more heat-sensitive color-forming compounds in combination, etc. However, it is only required to use at least one of said colorants.

Examples of the solvent used in this invention include polar aprotic solvents such as N-methyl-2-pyrrolidone, γ-butyrolactone, N,N-dimethylformamide, N,N-dimethylacetamide, and dimethyl sulfoxide, ethers such as tetrahydrofuran, dioxane, and propylene glycol monomethyl ether, ketones such as acetone, methyl ethyl ketone, diisobutyl ketone, and diacetone alcohol, esters such as ethyl acetate, propylene glycol monomethyl ether acetate, and ethyl lactate, aromatic hydrocarbons such as toluene, and xylene, etc. Any one of the solvents can be used, or two or more of them can also be used as a mixture.

It is preferred that the content of the solvent used in this invention is from 50 to 2000 parts by weight per 100 parts by weight of the polymer having one or more phenolic hydroxyl groups (a). An especially preferred range is from 100 to 1500 parts by weight.

Next the method for forming a heat resistant resin pattern using the photosensitive resin composition of this invention is explained below.

A substrate is coated with the photosensitive resin composition. The substrate can be a wafer of silicon, ceramic, gallium arsenide or the like, or such a wafer, on which an electrode and/or wiring composed of a metallic material such as copper, gold or titanium-based metal is formed, though not limited to them. Coating methods include spinner coating, spray coating, roll coating, etc. The coating film thickness depends on the coating method, the solid content and viscosity of the composition, etc. Usually the coating is performed to achieve a dried film thickness of 0.1 to 150 µm.

Then the substrate coated with the photosensitive resin composition is dried to obtain a photosensitive resin composition film. For drying, it is preferred to use an oven, hot plate, infrared radiation or the like in a temperature range from 50° C. to 150° C. for 1 minute to several hours. As required, drying in two steps of drying at 80° C. for 2 minutes and subsequently at 120° C. for 2 minutes or in more steps can also be employed.

Subsequently the photosensitive resin composition film is irradiated with chemical rays through a mask having a desired pattern, for exposure. The chemical rays include ultraviolet rays, visible rays, electron rays, X rays, etc. In this invention it is preferred to use the i-line (365 nm), h-line (405 nm) or g-line (436 nm) of a mercury lamp.

In the case where the resolution of the pattern is improved during development or in the case where the latitude of development conditions increases, the step of bake treatment can also be employed before development. A preferred temperature range for baking is from 50 to 180° C., and an especially more preferred range is from 60 to 150° C. A preferred period of time for baking is from 10 seconds to several hours. These ranges give advantages that the reaction progresses well and that the development time can also be kept short.

A heat resistant resin pattern can be formed from the photosensitive resin composition film by removing the exposed area using a developer after completion of exposure. A preferred developer is a tetramethylammonium aqueous solution or an aqueous solution of a compound showing alkalinity such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine or hexamethylenediamine. As the case may be, to the alkaline aqueous solution, any one or more in combination of the following can also be added: polar solvents such as N-methyl-2-pyrrolidone, N,N-dimethylformamide, N,N-dimethylacetamide, dimethyl sulfoxide, γ-butyrolactone and dimethylacrylamide, alcohols such as methanol, ethanol and isopropanol, esters such as ethyl lactate, propylene glycol monomethyl ether acetate, ketones such as cyclopentanone, cyclohexanone, isobutyl ketone and methyl isobutyl ketone. The developed film is treated by rinsing with water. Also in this case, an alcohol such as ethanol or isopropyl alcohol or an ester such as ethyl lactate or propylene glycol monomethyl ether acetate can also be added to water, for rinsing treatment.

After completion of development, the developed film is heat at a temperature of 200° C. to 500° C. for conversion into a heat resistant resin film. The heat treatment is performed by heating stepwise from a selected temperature or heating continuously at a constant rate in a selected temperature range for 5 minutes to 5 hours. For example, heat treatment is performed at 130° C., 200° C. and 350° C. for 30 minutes each. As another method, heating at a constant rate from room temperature to 400° C. taking 2 hours can also be employed.

The heat resistant resin film formed from the photosensitive heat resistant composition of this invention can be used, for example, as a passivation layer of a semiconductor, a protective coat of a semiconductor device, an interlayer dielectric film of a multilayer wiring for high density package, dielectric layer of an organic electro-luminescent element, etc.

EXAMPLES

This invention is explained below in reference to examples, but is not limited thereby or thereto. The patterning capabilities of the photosensitive resin compositions in the examples were evaluated according to the following methods.

1) Production of Photosensitive Resin Film

A 6-inch silicon wafer was coated with a photosensitive resin composition (hereinafter called a varnish) to have a film thickness of 14 to 16 µm after pre-baking, and pre-baked at 120° C. for 2 minutes using a hot plate (coating and developing apparatus Mark-7 produced by Tokyo Electron Ltd.), to obtain a photosensitive resin film.

2) Film Thickness Measuring Method

Rambda A STM-602 produced by Dainippon Screen Mfg. Co., Ltd. was used to measure pre-baked and developed films at a refractive index of 1.629 and a cured film at a refractive index of 1.773.

3) Exposure

A reticle having a pattern was set on an exposure machine (i-line stepper DSW-8000 produced by GCA), and a photosensitive resin film was exposed to the i-line at an intensity of 365 nm for different exposure periods of time.

4) Development

A developing apparatus (Mark-7 produced by Tokyo Electron Ltd.) was used for spraying an exposed film with 2.38% tetramethylammonium hydroxide aqueous solution at 50 rpm for 10 seconds, allowing it to stand at 0 rpm for 40 seconds, spraying it again for 10 seconds, allowing it to stand for 40 seconds, rinsing it at 400 rpm using water, and drying it at 3000 rpm for 10 seconds.

5) Calculation of Photosensitivity

After completion of exposure and development, the development time after which a 50 µm line-and-space pattern (1L/1S) was formed in 1:1 width (hereinafter this time is called the optimum exposure time) was identified.

6) Calculation of Resolution

The minimum pattern formed after the optimum exposure time was employed as the resolution.

7) Curing

A produced photosensitive resin film was heated in a nitrogen stream (oxygen concentration 20 ppm or less) at 140° C. for 30 minutes and heated up to 320° C. taking 1 hour, being heat-treated at 320° C. for 1 hour, using an inert gas oven (INH-21CD produced by Koyo Thermo Systems Co., Ltd.), to produce a cured film (heat resistant resin film).

8) Calculation of Degree of Shrinkage

After the production of a cured film, the degree of shrinkage was calculated from the following formula.

Degree of shrinkage (%)=(Film thickness after development−Film thickness after curing)÷Film thickness after development×100

9) Evaluation of Storage Stability of Composition

A varnish was allowed to stand at 23° C. for 2 weeks, and patterning was carried out as described in the above 1) through 5). The photosensitivity was then calculated.

10) Evaluation of Adhesion Property

A silicon substrate was coated with a varnish to have a film thickness of 10 μm after pre-baking, and pre-baked at 120° C. for 2 minutes using a hot plate (coating and developing apparatus Mark-7 produced by Tokyo Electron Ltd.). This film was placed in an oven and cured at 170° C. for 30 minutes and then at 320° C. for 1 hour, to obtain a polyimide film. The curing was carried out in air (oxygen concentration 20%). The cured film was cut to form a lattice of 10 lines and 10 rows at 2 mm intervals, and a Cellophane (trademark) adhesive tape was stuck to cover it and stripped. The number of peeled squares out of 100 squares was counted to evaluate the adhesion property. Before the evaluation by the stripping test, the cured film was subjected to a pressure cooker test (PCT) for 400 hours. A sample having less than 30 squares peeled was accepted and a sample having 30 or more squares peeled was rejected. The PCT treatment was carried out at saturation conditions of 121° C. and 2 atmospheric pressures.

Synthesis Example 1

Synthesis of Hydroxyl Group-Containing Acid Anhydride (a)

In a dry nitrogen stream, 18.3 g (0.05 mole) of 2,2-bis(3-amino-4-hydroxyphenyl)hexafluoropropane (BAHF) and 34.2 g (0.3 mole) of allyl glycidyl ether were dissolved into 100 g of gamma-butyrolactone (GBL), and the solution was cooled to −15° C. Into it, a solution with 22.1 g (0.11 mole) of trimellitic anhydride chloride dissolved in 50 g of GBL was added dropwise to ensure that the temperature of the reaction solution did not exceed 0° C. After completion of dropwise addition, reaction was performed at 0° C. for 4 hours. The solution was concentrated using a rotary evaporator, and 1 liter of toluene was added, to obtain a hydroxyl group-containing acid anhydride (a) represented by the following formula.

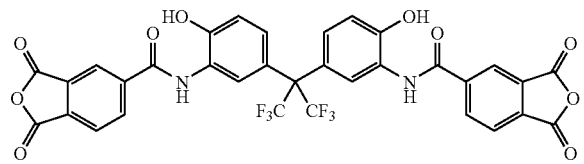

Hydroxyl Group-Containing Acid Anhydride (a)

Synthesis Example 2

Synthesis of Hydroxyl Group-Containing Diamine Compound (b)

Eighteen point three grams (0.05 mole) of BAHF was dissolved in 100 mL of acetone and 17.4 g (0.3 mole) of propylene oxide, and the solution was cooled to −15° C. Into the solution, a solution with 20.4 g (0.11 mole) of 4-nitrobenzoyl chloride dissolved in 100 mL of acetone was added dropwise. After completion of dropwise addition, reaction was performed at −15° C. for 4 hours, and the temperature was then returned to room temperature, to precipitate a white solid. It was collected by filtration and dried in vacuum at 50° C.

Thirty grams of the solid was placed in a 300 mL stainless steel autoclave, and dispersed into 250 mL of methyl cellosolve, then 2 g of 5% palladium-carbon being added. Into the mixture, hydrogen was introduced using a balloon, and reduction reaction was performed at room temperature. After lapse of about 2 hours, it was confirmed that the balloon was not deflated any more, and the reaction was terminated. After end of reaction, the reaction mixture was filtered to remove the palladium compound used as a catalyst, and the residue was concentrated using a rotary evaporator, to obtain a hydroxyl group-containing diamine compound (b) represented by the following formula. The obtained solid was used for reaction, as it was.

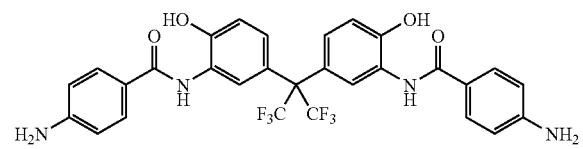

Hydroxyl Group-Containing Diamine (b)

Synthesis Example 3

Synthesis of Hydroxyl Group-Containing Diamine (c)

Fifteen point four grams (0.1 mole) of 2-amino-4-nitrophenol was dissolved into 50 mL of acetone and 30 g (0.34 mole) of propylene oxide, and the solution was cooled to −15° C. Into the solution, a solution with 11.2 g (0.055 mole) of isophthalic acid chloride dissolved in 60 mL of acetone was gradually added dropwise. After completion of dropwise addition, reaction was performed at −15° C. for 4 hours. Subsequently the temperature was returned to room temperature, and the produced precipitate was collected by filtration.

The precipitate was dissolved into 200 mL of GBL, and 3 g of 5% palladium-carbon was added. The mixture was vigorously stirred, and a balloon containing hydrogen gas was installed there. Stirring was continued at room temperature, till the hydrogen gas balloon was not deflated any more, and for further 2 hours, stirring was continued with the hydrogen gas balloon installed as it was. After completion of stirring, the palladium compound was removed by filtration, and the solution was concentrated to a half amount using a rotary evaporator. To the residue, ethanol was added for recrystallization, to obtain the crystal of the intended compound.

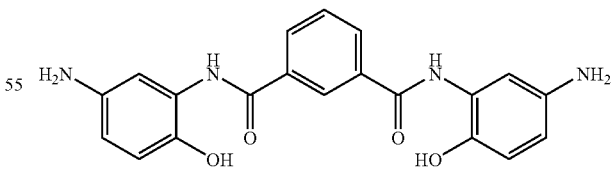

Hydroxyl Group-Containing Diamine (c)

Synthesis Example 4

Synthesis of Hydroxyl Group-Containing Diamine (d)

Fifteen point four grams (0.1 mole) of 2-amino-4-nitrophenol was dissolved into 100 mL of acetone and 17.4 g (0.3 mole) of propylene oxide, and the solution was cooled to −15° C. Into the solution, a solution with 20.4 g (0.11 mole) of 4-nitrobenzoyl chloride dissolved in 100 mL of acetone was gradually added dropwise. After completion of dropwise addition, reaction was performed at −15° C. for 4 hours. Then, the temperature was returned to room temperature, and the produced precipitate was collected by filtration. Then, as described for Synthesis Example 2, the crystal of the intended compound was obtained.

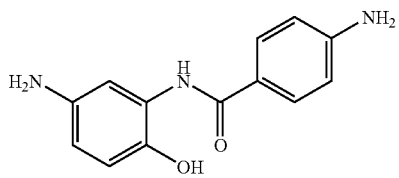

Hydroxyl Group-Containing Diamine (d)

Synthesis Example 5

Synthesis of Quinone Diazide Compound (e)

In a dry nitrogen stream, 16.1 g (0.05 mole) of BisP-RS (trade name, produced by Honshu Chemical Industry Co., Ltd.) and 26.86 g (0.1 mole) of 5-naphthoquinone diazide sulfonylic acid chloride were dissolved into 450 g of 1,4-dioxane, and the temperature was adjusted to room temperature. Into the solution, absolution with 10.12 g of triethylamine mixed with 50 g of 1,4-dioxane was added dropwise to ensure that the temperature of the system did not become 35° C. or higher. After completion of dropwise addition, the solution was stirred at 30° C. for 2 hours. The triethylamine salt was removed by filtration, and the filtrate was added into water, to cause precipitation. The precipitate was collected by filtration and dried using a vacuum dryer, to obtain a quinone diazide compound (e) represented by the following formula.

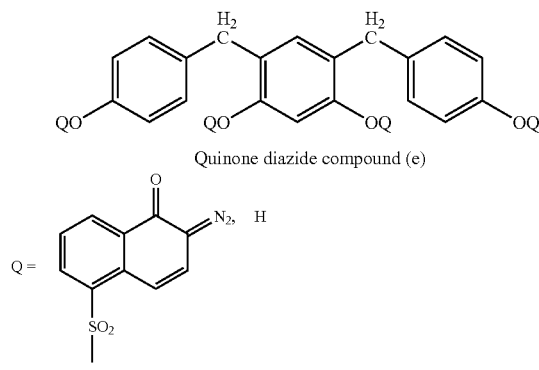

Quinone diazide compound (e)

Synthesis Example 6

Synthesis of Quinone Diazide Compound (f)

In a dry nitrogen stream, 15.31 g (0.05 mole) of TrisP-HAP (trade name, produced by Honshu Chemical Industry Co., Ltd.) and 40.28 g (0.15 mole) of 5-naphthoquinone diazide sulfonylic acid chloride were dissolved into 450 g of 1,4-dixoane, and the temperature was adjusted to room temperature. Into the solution, a solution with 15.18 g of triethylamine mixed with 50 g of 1,4-dioxane was added to obtain a quinone diazide compound (f) represented by the following formula as described for Synthesis Example 5.

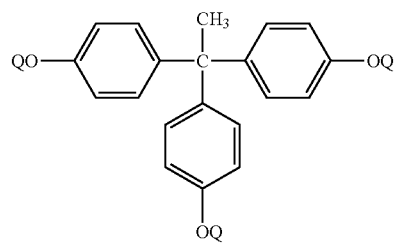

Quinone diazide compound (f)

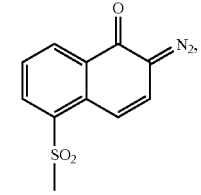

Synthesis Example 7

Synthesis of Quinone Diazide Compound (g)

In a dry nitrogen stream, 21.22 g (0.05 mole) of TrisP-PA (trade name, produced by Honshu Chemical Industry Co., Ltd.), 26.86 g (0.1 mole) of 5-naphthoquinone diazide sulfonylic acid chloride, and 13.43 g (0.05 mole) of 4-naphthoquinone diazide sulfonylic acid chloride were dissolved into 450 g of 1,4-dioxane, and the temperature was adjusted to room temperature. Into the solution, a solution with 12.65 g of triethylamine mixed with 50 g of 1,4-dioxane was added to obtain a quinone diazide compound (g) represented by the following formula as described for Synthesis Example 5.

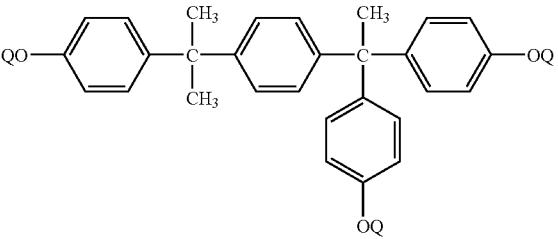

Quinone diazide compound (g)

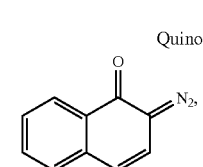

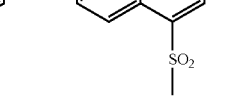

Synthesis Example 8

Synthesis of Quinone Diazide Compound (h)

In a dry nitrogen stream, 11.41 g (0.05 mole) of bisphenol A and 26.86 g (0.1 mole) of 4-naphthoquinone diazide sulfonylic acid chloride were dissolved into 450 g of 1,4-dioxane, and the temperature was adjusted to room temperature. Into the solution, a solution with 10.12 g of triethylamine mixed with 50 g of 1,4-dioxane was added to obtain a quinone diazide compound (h) represented by the following formula as described for Synthesis Example 5.

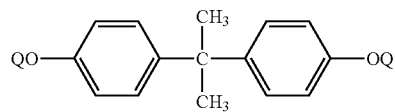

Quinone diazide compound (h)

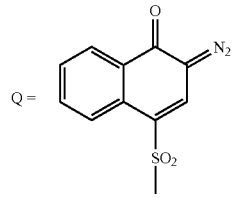

The compounds, photo acid generators, solubility speed enhancers, etc. used in the respective working examples and comparative examples are shown below.

Bis-Z

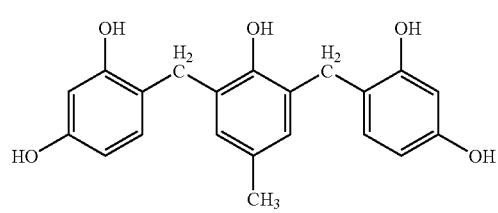

BisP-RS

TrisP-PA

BIR-PC

-continued

TrisP-HAP

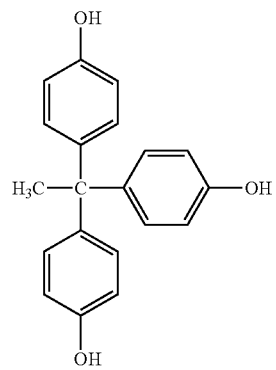

WPAG-314

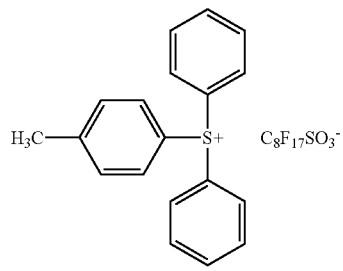

WPAG-505

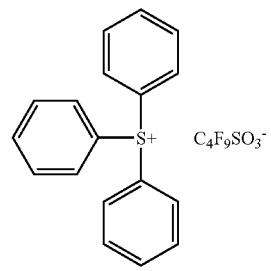

WPAG-567

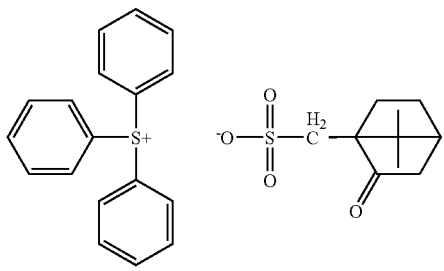

WPAG-350

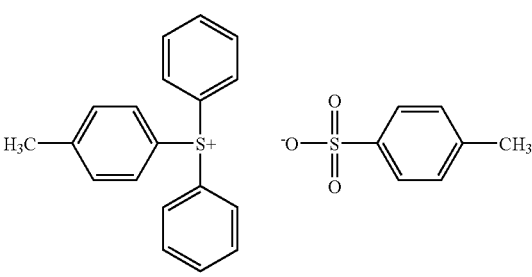

WPAG-360
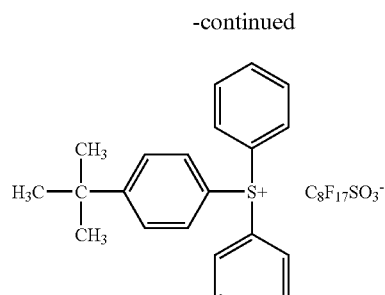
WPAG-372
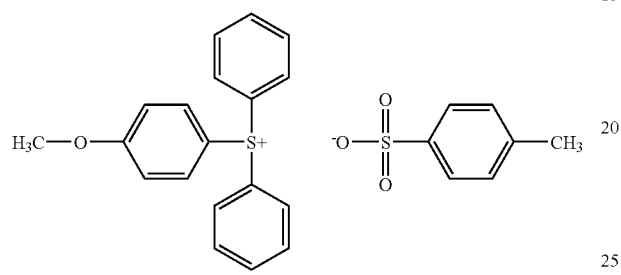
BDS-109
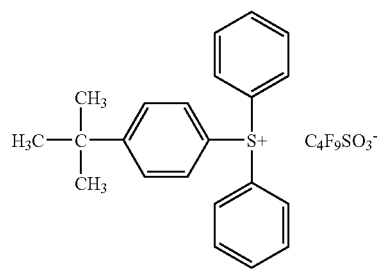
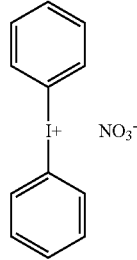
Diphenyliodonium nitrate
6M-24XL
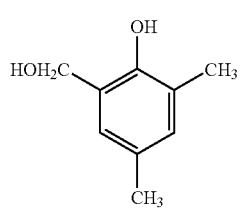
4M-26XL
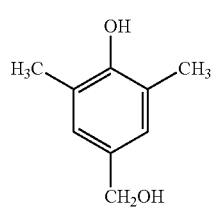
MML-TP26XV-MF
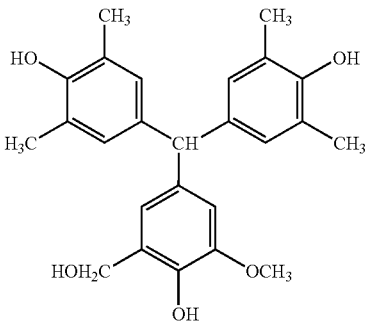
MOM-24X
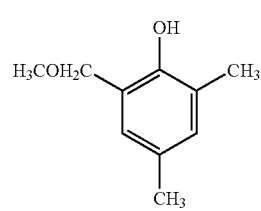
MOM-26X
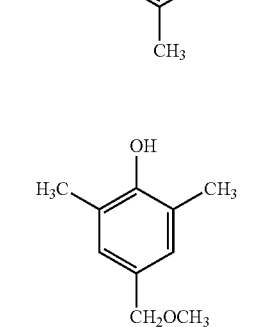
DML-MBPC
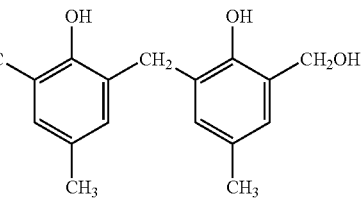
DMOM-PC
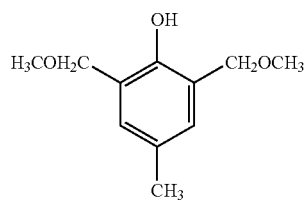
DML-PTBP
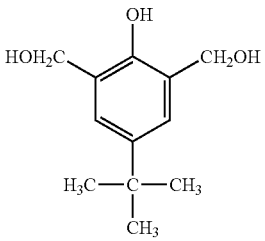

-continued

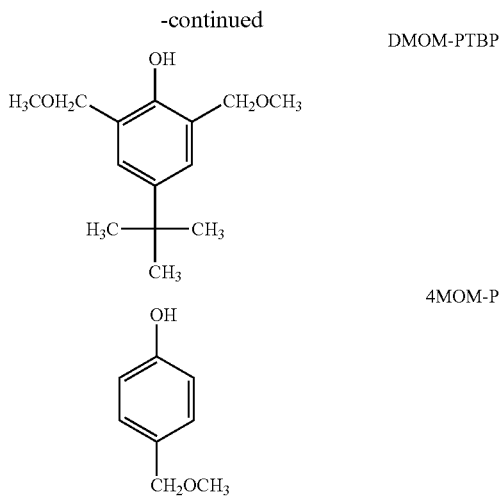

DMOM-PTBP

4MOM-P

Working Example 1

In a dry nitrogen stream, 5.01 g (0.025 mole) of 4,4'-diaminodiphenyl ether and 1.24 g (0.005 mole) of 1,3-bis(3-aminopropyl)tetramethyldisiloxane were dissolved into 50 g of N-methyl-2-pyrrolidone (NMP). Into the solution, 21.4 g (0.03 mole) of the hydroxyl group-containing acid anhydride (a) was added together with 14 g of NMP, and reaction was performed at 20° C. for 1 hour, and then at 50° C. for 4 hours. Subsequently, a solution with 7.14 g (0.06 mole) of N,N-dimethylformamide dimethyl acetal diluted by 5 g of NMP was added dropwise, taking 10 minutes. After completion of dropwise addition, the solution was stirred at 50° C. for 3 hours, to obtain polymer solution A.

Two grams of the quinone diazide compound (e), 1.2 g of 6M-24XL (trade name, produced by Honshu Chemical Industry co., Ltd.) as a compound having one methylol group and 0.42 g of WPAG-314 (trade name, produced by Wako Pure Chemical Industries, Ltd.) were added to 40 g of the obtained polymer solution A (polymer weight: 12 g), to obtain a photosensitive polyimide precursor composition as varnish A. The obtained varnish was used to evaluate the patterning capabilities as described before.

Working Example 2

In a dry nitrogen stream, 15.1 g (0.025 mole) of the hydroxyl group-containing diamine (b) was dissolved into 50 g of N-methyl-2-pyrrolidone (NMP). Into the solution, 17.5 g (0.025 mole) of the hydroxyl group-containing acid anhydride (a) was added together with 30 g of pyridine, and reaction was performed at 60° C. for 6 hours. After completion of reaction, the solution was added into 2 L of water, to precipitate a solid polymer. It was collected by filtration and dried in an 80° C. vacuum dryer for 20 hours, to obtain polymer B.

Ten grams of the solid polymer B obtained as described above was weighed, and it was dissolved into 30 g of GBL together with 2 g of the quinone diazide compound (f), 2 g of 4M-26XL (trade name, produced by Honshu Chemical Industry Co., Ltd.) as a compound having one methylol group, 0.5 g of WPAG-505 (trade name, produced by Wako Pure Chemical Industries, Ltd.) and 1.5 g of Bis-Z (trade name, produced by Honshu Chemical Industry Co., ltd.), to obtain a photosensitive polyimide precursor composition as varnish B. The obtained varnish was used to evaluate the patterning capabilities as described before.

Working Example 3

In a dry nitrogen stream, 17 g (0.045 mole) of the hydroxyl group-containing diamine compound (c) and 1.24 g (0.005 mole) of 1,3-bis(3-aminopropyl)tetramethyldisiloxane were dissolved into 50 g of NMP. Into the solution, 12.4 g (0.04 mole) of 3,3',4,4'-diphenylethertetracarboxylic anhydride (ODPA) was added together with 21 g of NMP, and reaction was performed at 20° C. for 1 hour and then at 50° C. for 2 hours. Into the solution, 0.98 g (0.01 mole) of maleic anhydride was added, and the mixture was stirred at 50° C. for 2 hours. Then, a solution with 14.7 g (0.1 mole) of N,N-dimethylformamide diethyl acetal diluted by 5 g of NMP was added dropwise, taking 10 minutes. After completion of dropwise addition, the mixture was stirred at 50° C. for 3 hours, to obtain polymer solution C.

One point six grams of the quinone diazide compound (g), 1 g of MML-TP26XV-MF (trade name, produced by Honshu Chemical Industry Co., Ltd.) as a compound having one methylol group and 0.1 g of WPAG-567 (trade name, produced by Wako Pure Chemical Industries, Ltd.) were dissolved into 30 g of the obtained polymer solution C (polymer weight: 10 g), to obtain a photosensitive polyimide precursor composition as varnish C. The obtained varnish was used to evaluate the patterning capabilities as described before.

Working Example 4

In a dry nitrogen stream, 6.08 g (0.025 mole) of the hydroxyl group-containing diamine compound (d), 4.51 g (0.0225 mole) of 4,4'-diaminodiphenyl ether and 0.62 g (0.0025 mole) of 1,3-bis(3-aminopropyl)tetramethyldisiloxane were dissolved into 70 g of NMP. Twenty four point nine nine grams (0.035 mole) of the hydroxyl group-containing acid anhydride (a) and 4.41 g (0.015 mole) of 3,3',4,4'-biphenyltetracarboxylic dianhydride were added together with 25 g of NMP at room temperature, and the mixture was stirred as it was at room temperature for 1 hour and then at 50° C. for 2 hours. Subsequently, a solution with 17.6 g (0.2 mole) of glycidyl methyl ether diluted by 10 g of NMP was added, and the solution was stirred at 70° C. for 6 hours, to obtain polymer solution D.

Into 40 g of the polymer solution D (polymer weight: 14.27 g), 2.5 of the quinone diazide compound (h), 1 g of WPAG-350 (trade name, produced by Wako Pure Chemical Industries, Ltd.), 1.5 g of MOM-26X (trade name, produced by Honshu Chemical Industry Co., Ltd.) as a compound having one methoxymethyl group, and 0.5 g of m-acetylaminophenyltrimethoxysilane were dissolved, to obtain a photosensitive polyimide precursor composition as varnish D. The obtained varnish was used to evaluate the patterning capabilities as described before.

Working Example 5

In a dry nitrogen stream, 13.6 g (0.018 mole) of the hydroxyl group-containing diamine (b) and 0.5 g (0.002 mole) of 1,3-bis(3-aminopropyl)tetramethyldisiloxane were dissolved into 50 g of NMP. Into the solution, 17.86 g (0.025 mole) of the hydroxyl group-containing acid anhydride (a) was added together with 30 g of pyridine, and reaction was performed at 60° C. for 2 hours. Then, 0.59 g (0.005 mole) of 4-ethynylaniline was added as an end cap compound, and reaction was further performed at 60° C. for 2 hours. After completion of reaction, the solution was added into 2 L of water, to precipitate a solid polymer, and it was collected by filtration. The solid polymer was dried by an 80° C. vacuum dryer for 20 hours, to obtain polymer E.

Ten grams of the solid of the polymer E obtained as described above was weighed, and it was dissolved into 30 g of GBL together with 2 g of the quinone diazide compound (e), 0.5 g of MOM-24X (trade name, produced by Honshu Chemical Industry Co., Ltd.) as a compound having one methoxymethyl group, 0.01 g of WPAG-360 (trade name, produced by Wako Pure Chemical Industries, Ltd.) and 0.5 g of 3,3'-diaminodiphenyltetramethoxydisiloxane, to obtain a photosensitive polyimide precursor composition as varnish E. The obtained varnish was used to evaluate the patterning capabilities as described before.

Working Example 6

Polymer F was obtained as described for Working Example 5, except that 0.54 g (0.005 mole) of 3-aminophenol was used instead of 4-ethynylaniline used as an end cap compound. Ten grams of the solid of the polymer F obtained as described above was weighed, and it was dissolved into 30 g of GBL together with 2 g of the quinone diazide compound (f), 2 g of MML-TP26XV-MF as a compound having one methylol group, 0.005 g of WPAG-372 (trade name, produced by Wako Pure Chemical Industries, Ltd.), 1.5 g of BIR-PC (trade name, produced by Honshu Chemical Industry Co., ltd.), and 0.5 g of 3,3'-diacetylaminodiphenyltetramethoxydisiloxane, to obtain a photosensitive polyimide precursor composition as varnish F. The obtained varnish was used to evaluate the patterning capabilities as described before.

Working Example 7

Ten grams of the solid of the polymer B obtained in Working Example 2 was weighed, and it was dissolved into 30 g of GBL together with 2 g of the quinone diazide compound (g), 0.03 g of WPAG-314 (trade name, produced by Wako Pure Chemical Industry Co., Ltd.), 2 g of MOM-26X as a compound having one methoxymethyl group, 1.5 g of TrisP-PA (trade name, produced by Honshu Chemical Industry Co., Ltd.), and 0.5 g of vinyltrimethoxysilane, to obtain a photosensitive polyimide precursor composition as varnish G. The obtained varnish was used to evaluate the patterning capabilities as described before.

Working Example 8

One point six grams of the quinone diazide compound (g), 1 g of 4M-26XL as a compound having one methylol group, 0.5 g of BDS-109 (trade name, produced by Midori Kagaku Co., Ltd.), 0.01 g of WPAG-567 (trade name, produced by Wako Pure Chemical Industries, Ltd.), 0.5 g of m-aminophenyltrimethoxysilane, and 0.05 g of DMOM-PTBT (trade name, produced by Honshu Chemical Industry Co., Ltd.) were dissolved into 30 g of the polymer solution C obtained in Working Example 3 (polymer weight: 10 g), to obtain a photosensitive polyimide precursor composition as varnish H. The obtained varnish was used for evaluating the patterning capabilities as described before.

Working Example 9

In a dry nitrogen stream, 18.3 g (0.05 mole) of BAHF was dissolved into 50 g of NMP and 26.4 g (0.3 mole) of glycidyl methyl ether, and the temperature of the solution was lowered to −15° C. Into the solution, a solution with 14.7 g (0.05 mole) of diphenyl ether dicarboxylic acid dichloride dissolved in 25 g of GBL was added dropwise, to ensure that the inside temperature did not exceed 0° C. After completion of dropwise addition, stirring was continued at −15° C. for 6 hours. After completion of reaction, the solution was added into 3 L of water, to produce a white precipitate. It was collected by filtration, and washed with water three times, then being dried by an 80° C. vacuum dryer for 20 hours, to obtain polymer G.

Ten grams of the solid of the obtained polymer G, 2 g of the quinone diazide compound (f), 1 g of 6M-24XL as a compound having one methylol group, 0.7 g of WPAG-314 (trade name, produced by Wako Pure Chemical Industries, Ltd.), 0.5 g of p-aminophenyltrimethoxysilane, and 1 g of DMOM-PTBT were dissolved into 30 g of GBL, to obtain a photosensitive polybenzoxazole precursor composition as varnish I. The obtained varnish was used to evaluate the patterning capabilities as described before.

Working Example 10

A photosensitive polyimide precursor composition as varnish J was obtained as described for Working Example 1, except that the added amount of 6M-24XL as a compound having one methylol group was 7.2 g. The obtained varnish was used to evaluate the patterning capabilities as described before.

Working Example 11

A photosensitive polyimide precursor composition as varnish K was obtained as described for Working Example 2, except that the added amount of 4M-26XL as a compound having one methylol group was 0.02 g. The obtained varnish was used to evaluate the patterning capabilities as described before.

Working Example 12

A photosensitive polyimide precursor composition as varnish L was obtained as described for Working Example 9, except that the added amount of DMOM-PTBT was 2 g. The obtained varnish was used to evaluate the patterning capabilities as described before.

Working Example 13

A photosensitive polyimide precursor composition as varnish M was obtained as described for Working Example 8, except that 1 g of 4MOM-P was used instead of 4M-26XL as a compound having one methylol group. The obtained varnish was used to evaluate the patterning capabilities as described before.

Working Example 14

A photosensitive polyimide precursor composition as varnish N was obtained as described for Working Example 9, except that 1 g of 4MOM-P was used instead of 6M-24XL as a compound having one methylol group. The obtained varnish was used to evaluate the patterning capabilities as described before.

Working Example 15

Ten grams of the solid of novolac resin Resitop XPS-4958 (trade name, produced by Gunei Chemical Industry Co., Ltd.), 2 g of the quinone diazide compound (f), 1 g of 4MOM-P as a compound having one methylol group, 0.7 g of WPAG-567 (trade name, produced by Wako Pure Chemical Industries, Ltd.), 0.5 g of p-aminophenyltrimethoxysilane, and 1 g of DMOM-PTBT were dissolved into 30 g of GBL, to obtain a photosensitive novolac resin composition as varnish O. The obtained varnish was used to evaluate the patterning capabilities as described before.

Comparative Example 1

A photosensitive polyimide precursor composition as varnish P was obtained as described for Working Example 1, except that WPAG-314 was not used and that 1.2 g of DML-MBPC (trade name, produced by Honshu Chemical Industry Co., Ltd.) as a compound having plural methylol groups was used instead of 6M-24XL as a compound having one methylol group. The obtained varnish was used to evaluate the patterning capabilities as described before.

Comparative Example 2

A photosensitive polyimide precursor composition as varnish Q was obtained as described for Working Example 2, except that WPAG-505 was not used and that 2 g of DMOM-PC (trade name, produced by Honshu Chemical Industry Co., Ltd.) was used as a compound having plural methylol groups instead of 4M-26XL as a compound having one methylol group. The obtained varnish was used to evaluate the patterning capabilities as described before.

Comparative Example 3

A photosensitive polyimide precursor composition as varnish R was obtained as described for Working Example 9, except that WPAG-567 and 6M-24XL as a compound having one methylol group were not used. The obtained varnish was used to evaluate the patterning capabilities as described before.

Comparative Example 4

In a dry nitrogen stream, a flask was charged with 24.82 g (0.08 mole) of 3,3',4,4'-diphenyl ether tetracarboxylic dianhydride, 11.86 g (0.16 mole) of n-butyl alcohol, 0.4 g (0.004 mole) of triethylamine and 110 g of NMP, and reaction was performed at room temperature for 8 hours with stirring, to obtain an NMP solution of 3,3',4,4'-diphenyl ether tetracarboxylic di-n-butyl ester.

Then, the flask was cooled to 0° C., and 17.13 g (0.144 mole) of thionyl chloride was added dropwise. Reaction was performed for 1 hour, to obtain 3,3',4,4'-diphenyl ether tetracarboxylic di-n-butyl ester dichloride as a solution. Subsequently, a 0.5-liter flask with a stirrer and thermometer was charged with 105 g of N-methylpyrrolidone, and 26.37 g (0.072 mole) of BAHF was added. The mixture was stirred and dissolved, and subsequently 22.78 g (0.288 mole) of pyridine was added. With the temperature kept at 0 to 5° C., the 3,3',4,4'-diphenyl ether tetracarboxylic di-n-butyl ester dichloride solution was added dropwise, taking 20 minutes, and subsequently with the temperature raised to 30° C., stirring was continued for 1 hour. The solution was added into 3 liters of water, to cause precipitation, and the precipitate was collected and washed. The solid polymer was dried by an 80° C. vacuum dryer for 20 hours, to obtain polymer H.

Ten grams of the solid of the obtained polymer H, 2 g of the quinone diazide compound (g), 0.1 g of diphenyliodonium nitrate and 1.5 g of DMOM-PTBP as a compound having plural methylol groups were dissolved into 30 g of NMP, to obtain a photosensitive polyimide precursor composition as varnish S. The obtained varnish was used to evaluate the patterning capabilities as described before.

Comparative Example 5

Ten grams of the solid of the polymer H obtained in Comparative Example 4, 2 g of the quinone diazide compound (h), 0.1 g of diphenyliodonium nitrate, and 0.5 g of DMOM-PC as a compound having plural methylol groups were dissolved into 30 g of NMP, to obtain a photosensitive polyimide precursor as varnish T. The obtained varnish was used to evaluate the patterning capabilities as described before.

Comparative Example 6

Ten grams of the solid of the polymer H obtained in Comparative Example 4, 2 g of the quinone diazide compound (h), 0.1 g of diphenyliodonium nitrate, and 1.5 g of TrisP-PA (trade name, produced by Honshu Chemical Industry Co., Ltd.) were dissolved into 30 g of NMP, to obtain a photosensitive polyimide precursor composition as varnish U. The obtained varnish was used to evaluate the patterning capabilities as described before.

Comparative Example 7

A photosensitive novolac resin composition as varnish V was obtained as described for Working Example 15; except that 4MOM-P and DMOM-PTBP were not used. The obtained varnish was used to evaluate the patterning capabilities as described before.

The vanish compositions of Working Examples 1 through 15 and Comparative Examples 1 through 7 are shown in Table 1, and evaluation results are shown in Table 2.

TABLE 1

| Varnish | Polymer | Ingredient (b) | Compound having plural methylol groups | Photo acid generator | | Compound represented by general formula (15) or (16), or vinylsilane compound | Solubility speed enhancer |
|---|---|---|---|---|---|---|---|
| Working Example 1 | A | A | 6M-24XL (10 parts by weight) | Nil | Quinone diazide (e) | WPAG-314 (3 parts by weight) | Nil | Nil |
| Working Example 2 | B | B | 4M-26XL (20 parts by weight) | Nil | Quinone diazide (f) | WPAG-505 (5 parts by weight) | Nil | Bis-Z |

TABLE 1-continued

| | Varnish | Polymer | Ingredient (b) | Compound having plural methylol groups | Photo acid generator | | Compound represented by general formula (15) or (16), or vinylsilane compound | Solubility speed enhancer |
|---|---|---|---|---|---|---|---|---|
| Working Example 3 | C | C | MML-TP26XV-MF (10 parts by weight) | Nil | Quinone diazide (g) | WPAG-567 (1 parts by weight) | Nil | Nil |
| Working Example 4 | D | D | MOM-26X (10.5 parts by weight) | Nil | Quinone diazide (h) | WPAG-350 (7 parts by weight) | m-acetylaminophenyl-trimethoxysilane | Nil |
| Working Example 5 | E | E | MOM-24X (5 parts by weight) | Nil | Quinone diazide (e) | WPAG-360 (0.1 parts by weight) | 3,3'-diaminodiphenyl-tetramethoxydisiloxane | Nil |
| Working Example 6 | F | F | MML-TP26XV-MF (20 parts by weight) | Nil | Quinone diazide (f) | WPAG-372 (0.05 parts by weight) | 3,3'-diacetylaminodiphenyl-tetramethoxydisiloxane | BIR-PC |
| Working Example 7 | G | B | MOM-26X (20 parts by weight) | Nil | Quinone diazide (g) | WPAG-314 (0.3 parts by weight) | Vinyltrimethoxysilane | TrisP-PA |
| Working Example 8 | H | C | 4M-26XL (10 parts by weight) | DMOM-PTBT (0.5 parts by weight) | Quinone diazide (g) | BDS-109 (5 parts by weight) WPAG-567 (0.1 parts by weight) | m-aminophenyl-trimethoxysilane | Nil |
| Working Example 9 | I | G | 6M-24XL (10 parts by weight) | DMOM-PTBT (10 parts by weight) | Quinone diazide (f) | WPAG-314 (7 parts by weight) | p-aminophenyl-trimethoxysilane | Nil |
| Working Example 10 | J | A | 6M-24XL (60 parts by weight) | Nil | Quinone diazide (e) | WPAG-314 (3 parts by weight) | Nil | Nil |
| Working Example 11 | K | B | 4M-26XL (0.2 parts by weight) | Nil | Quinone diazide (f) | WPAG-505 (5 parts by weight) | Nil | Bis-Z |
| Working Example 12 | L | G | 6M-24XL (10 parts by weight) | DMOM-PTBT (20 parts by weight) | Quinone diazide (f) | WPAG-314 (7 parts by weight) | p-aminophenyl-trimethoxysilane | Nil |
| Working Example 13 | M | C | 4MOM-P (10 parts by weight) | DMOM-PTBT (0.5 parts by weight) | Quinone diazide (g) | BDS-109 (5 parts by weight) WPAG-567 (0.1 parts by weight) | m-aminophenyl-trimethoxysilane | Nil |
| Working Example 14 | N | G | 4MOM-P (10 parts by weight) | DMOM-PTBT (10 parts by weight) | Quinone diazide (f) | WPAG-314 (7 parts by weight) | p-aminophenyl-trimethoxysilane | Nil |
| Working Example 15 | O | — | 4MOM-P (10 parts by weight) | DMOM-PTBT (10 parts by weight) | Quinone diazide (f) | WPAG-567 (7 parts by weight) | p-aminophenyl-trimethoxysilane | Nil |
| Comparative Example 1 | P | A | Nil | DML-MBPC (10 parts by weight) | Quinone diazide (e) | Nil | Nil | Nil |
| Comparative Example 2 | Q | B | Nil | DMOM-PC (20 parts by weight) | Quinone diazide (f) | Nil | Nil | Bis-Z |
| Comparative Example 3 | R | C | Nil | DMOM-PTBP (10 parts by weight) | Quinone diazide (f) | Nil | p-aminophenyl-trimethoxysilane | Nil |
| Comparative Example 4 | S | H | Nil | DMOM-PTBP (15 parts by weight) | Quinone diazide (g) | Diphenyliodonium nitrate (1 part by weight) | Nil | Nil |
| Comparative Example 5 | T | H | Nil | DMOM-PC (5 parts by weight) | Quinone diazide (h) | Diphenyliodonium nitrate (1 part by weight) | Nil | Nil |
| Comparative Example 6 | U | H | Nil | Nil | Quinone diazide (h) | Diphenyliodonium nitrate (1 part by weight) | Nil | TrisP-PA |
| Comparative Example 7 | V | — | Nil | Nil | Quinone diazide (f) | WPAG-314 (7 parts by weight) | p-aminophenyl-trimethoxysilane | Nil |

(Each parenthesized numeral shows the added amount of each ingredient per 100 parts by weight of the polymer.)

TABLE 2

| | Varnish | Film thickness after pre-baking (μm) | Film thickness after development (μm) | Film thickness after curing (μm) | Patterning capabilities | | | | Photosensitivity after having been allowed to stand for 2 weeks (msec) | Adhesion property (number of peeled squares) |
|---|---|---|---|---|---|---|---|---|---|---|
| | | | | | Photosensitivity (msec) | Resolution (μm) | Degree of shrinkage (%) | Form | | |
| Working Example 1 | A | 14.5 | 13.3 | 10.5 | 600 | 5 | 21 | Good | 800 | 20 |
| Working Example 2 | B | 14.5 | 13.5 | 10.5 | 550 | 7 | 22 | Good | 750 | 20 |
| Working Example 3 | C | 14.5 | 13.5 | 10.3 | 650 | 7 | 24 | Good | 850 | 20 |
| Working Example 4 | D | 14.7 | 13.6 | 10.6 | 600 | 5 | 22 | Good | 600 | 0 |
| Working Example 5 | E | 14.7 | 13.6 | 10.4 | 650 | 7 | 24 | Good | 650 | 0 |
| Working Example 6 | F | 14.7 | 13.5 | 10.3 | 650 | 5 | 24 | Good | 850 | 0 |
| Working Example 7 | G | 14.7 | 13.6 | 10.4 | 600 | 5 | 24 | Good | 600 | 10 |
| Working Example 8 | H | 14.2 | 13 | 10 | 500 | 3 | 23 | Good | 600 | 0 |
| Working Example 9 | I | 14.4 | 13.2 | 10.3 | 450 | 3 | 22 | Good | 550 | 0 |
| Working Example 10 | J | 15.1 | 13.9 | 10.4 | 700 | 7 | 24 | Rather deformed | 900 | 20 |
| Working Example 11 | K | 14.9 | 13.7 | 10.4 | 750 | 7 | 26 | Good | 1000 | 25 |
| Working Example 12 | L | 15.2 | 13.9 | 11.1 | 350 | 5 | 20 | Rather strained | 500 | 0 |
| Working Example 13 | M | 14.2 | 13 | 10 | 500 | 3 | 23 | Good | 500 | 0 |
| Working Example 14 | N | 14.5 | 13.3 | 10.4 | 450 | 3 | 22 | Good | 450 | 0 |
| Working Example 15 | O | 14 | 13.5 | 9.7 | 450 | 3 | 28 | Good | 450 | 0 |
| Comparative Example 1 | P | 16 | 14.6 | 10.7 | 950 | 10 | 27 | Rather strained | 1200 | 25 |
| Comparative Example 2 | Q | 16.1 | 14.3 | 10.6 | 850 | 15 | 28 | Strained | 850 | 20 |
| Comparative Example 3 | R | 15.8 | 14 | 10.2 | 900 | 10 | 27 | Rather strained | 1200 | 0 |
| Comparative Example 4 | S | 15.7 | 14 | 10.2 | 1000 | 20 | 27 | Strained | 1000 | 20 |
| Comparative Example 5 | T | 16.1 | 14.3 | 10.2 | 1000 | 20 | 29 | Good | 1000 | 25 |
| Comparative Example 6 | U | 16.4 | 15 | 10.5 | 1100 | 30 | 30 | Deformed | 1100 | 25 |
| Comparative Example 7 | V | 14.2 | 13.7 | 8 | 550 | 30 | 42 | Good | 550 | 0 |

The invention claimed is:

1. A photosensitive resin composition, comprising:
   (a) a polymer having one or more phenolic hydroxyl groups;
   (b) a compound having a phenolic hydroxyl group and containing only one alkoxymethyl group and no methylol group; and
   (c) a photo acid generator.

2. A photosensitive resin composition, according to claim 1, wherein the polymer having one or more phenolic hydroxyl groups contains, as a main component, the structural units represented by the following general formula (1):

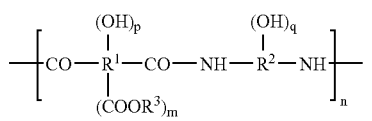

(1)

wherein $R^1$ denotes a divalent to octavalent organic group with 2 or more carbon atoms;
$R^2$ denotes a divalent to hexavalent organic group with 2 or more carbon atoms;
$R^3$ denotes a hydrogen or organic group with 1 to 20 carbon atoms;
n is in a range from 10 to 100000;
m denotes an integer of 0 to 2; and
p and q denote, respectively independently, an integer of 0 to 4, subject to p+q<0.

3. A photosensitive resin composition according to any one of claims 1 through 2, wherein two or more photo acid generators are used as the photo acid generator.

4. A photosensitive resin composition according to claim 3, wherein at least one of the two or more photo acid generators is a quinone diazide compound, while at least another one is a compound selected from a sulfonium salt, phosphonium salt and diazonium salt.

5. A photosensitive resin composition according to claim 4, wherein the sulfonium salt is at least one selected from the following general formulae (2) through (4):

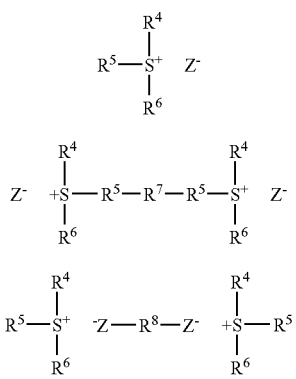

wherein $R^4$ to $R^6$ denote, respectively independently, an organic group with 1 to 20 carbon atoms;

$R^7$ and $R^8$ denote, respectively independently, a single bond or organic group with 1 to 20 carbon atoms;

$Z^-$ denotes an anion portion selected from $R^9SO_2^-$, $R^9COO^-$ and $SbF_6^-$; and $R^9$ denotes an organic group with 1 to 20 carbon atoms.

6. A photosensitive resin composition according to claim 4, wherein the sulfonium salt is a triarylsulfonium salt.

7. A photosensitive resin composition according to claim 1, wherein the compound having a phenolic hydroxyl group is represented by the following general formula (5):

$$\text{(5)}$$

wherein $R^{10}$ denotes an organic group with 1 to 20 carbon atoms;

$R^{11}$ denotes an organic group with 1 to 20 carbon atoms as at least one functional group selected from an alkyl group, vinyl group, ester group, amide group, ethynyl group, phenoxy group, sulfone group, thioether group, phenyl group, fluoroalkyl group and ketone group, fluorine or alkoxy group with 1 to 20 carbon atoms;

y denotes an integer of 0 to 4; and z denotes an integer of 1 to 5, subject to $y+z \leqq 5$.

8. A photosensitive resin composition according to claim 7, wherein y denotes 0.

9. A photosensitive resin composition according to claim 4, wherein the content of at least one compound selected from a sulfonium salt, phosphonium salt and diazonium salt among the two or more photo acid generators is from 3 to 30 parts by weight per 100 parts by weight of the polymer having one or more phenolic hydroxyl groups.

\* \* \* \* \*

UNITED STATES PATENT AND TRADEMARK OFFICE
CERTIFICATE OF CORRECTION

PATENT NO. : 7,455,948 B2
APPLICATION NO. : 11/274222
DATED : November 25, 2008
INVENTOR(S) : Ryuichiro Taniguchi et al.

It is certified that error appears in the above-identified patent and that said Letters Patent is hereby corrected as shown below:

In the Claims:

In Claim 2, column 54, line 56, please replace "$p+q<0$" with --$p+q>0$--.

Signed and Sealed this

Twenty-fourth Day of February, 2009

JOHN DOLL
*Acting Director of the United States Patent and Trademark Office*